US012040162B2

(12) United States Patent
Kozlowski et al.

(10) Patent No.: US 12,040,162 B2
(45) Date of Patent: Jul. 16, 2024

(54) PLASMA APPARATUS AND METHODS FOR PROCESSING FEED MATERIAL UTILIZING AN UPSTREAM SWIRL MODULE AND COMPOSITE GAS FLOWS

(71) Applicant: 6K Inc., North Andover, MA (US)

(72) Inventors: Michael C. Kozlowski, Reading, MA (US); Michael Resnick, Lawrence, MA (US); Pawel Matys, Jupiter, FL (US)

(73) Assignee: 6K Inc., North Andover, MA (US)

( * ) Notice: Subject to any disclaimer, the term of this patent is extended or adjusted under 35 U.S.C. 154(b) by 0 days.

(21) Appl. No.: 18/330,602

(22) Filed: Jun. 7, 2023

(65) Prior Publication Data

US 2023/0411123 A1 Dec. 21, 2023

Related U.S. Application Data

(60) Provisional application No. 63/350,746, filed on Jun. 9, 2022.

(51) Int. Cl.
*H01J 37/32* (2006.01)

(52) U.S. Cl.
CPC .. *H01J 37/32449* (2013.01); *H01J 37/32201* (2013.01)

(58) Field of Classification Search
None
See application file for complete search history.

(56) References Cited

U.S. PATENT DOCUMENTS 1,699,205 A 1/1929 Emil et al.
2,892,215 A 6/1959 Gerhard et al.
3,290,723 A 12/1966 John et al.
3,293,334 A 12/1966 Bylund et al.
3,434,831 A 3/1969 Knopp
3,466,165 A 9/1969 Rhys et al.
RE26,879 E 5/1970 Kelso
3,652,259 A 3/1972 Knopp
3,802,816 A 4/1974 Kaufmann
3,845,344 A 10/1974 Rainer
3,909,241 A 9/1975 Cheney et al.
3,966,374 A 6/1976 Honnorat et al.
3,974,245 A 8/1976 Cheney et al.
4,076,640 A 2/1978 Forgensi et al.
4,177,026 A 12/1979 Honnorat et al.
(Continued)

FOREIGN PATENT DOCUMENTS

AU 2003211869 A1 9/2003
AU 2014394102 B2 6/2020
(Continued)

OTHER PUBLICATIONS

"Build Boldly", Technology Demonstration, 6K Additive, [publication date unknown], in 11 pages.
(Continued)

*Primary Examiner* — Srinivas Sathiraju

(74) *Attorney, Agent, or Firm* — Knobbe, Martens, Olson & Bear, LLP

(57) ABSTRACT

Disclosed herein are systems, methods, and devices processing feed material utilizing an upstream swirl module and composite gas flows. Some embodiments are directed to a microwave plasma apparatus for processing a material, comprising: a first flow module, a second flow module, and a liner.

19 Claims, 9 Drawing Sheets

(56) References Cited

U.S. PATENT DOCUMENTS 4,212,837 A 7/1980 Kubo et al.
4,221,554 A 9/1980 Oguchi et al.
4,221,775 A 9/1980 Anno
4,265,730 A 5/1981 Hirose et al.
4,423,303 A 12/1983 Hirose et al.
4,431,449 A 2/1984 Dillon et al.
4,439,410 A 3/1984 Santen et al.
4,544,404 A 10/1985 Yolton et al.
4,569,823 A 2/1986 Westin
4,599,880 A 7/1986 Stepanenko et al.
4,611,108 A 9/1986 Leprince et al.
4,670,047 A 6/1987 Kopatz et al.
4,692,584 A 9/1987 Caneer, Jr.
4,705,560 A 11/1987 Kemp et al.
4,711,660 A 12/1987 Kemp et al.
4,711,661 A 12/1987 Kemp et al.
4,714,587 A 12/1987 Eylon et al.
4,731,110 A 3/1988 Kopatz et al.
4,731,111 A 3/1988 Kopatz et al.
4,772,315 A 9/1988 Johnson et al.
4,778,515 A 10/1988 Kemp et al.
4,780,131 A 10/1988 Kemp et al.
4,783,216 A 11/1988 Kemp et al.
4,783,218 A 11/1988 Kemp et al.
4,787,934 A 11/1988 Johnson et al.
4,802,915 A 2/1989 Kopatz et al.
4,836,850 A 6/1989 Kemp et al.
4,859,237 A 8/1989 Johnson et al.
4,923,509 A 5/1990 Kemp et al.
4,923,531 A 5/1990 Fisher
4,943,322 A 7/1990 Kemp et al.
4,944,797 A 7/1990 Kemp et al.
4,952,389 A 8/1990 Szymanski et al.
5,022,935 A 6/1991 Fisher
5,032,202 A 7/1991 Tsai et al.
5,041,713 A 8/1991 Weidman
5,095,048 A 3/1992 Takahashi et al.
5,114,471 A 5/1992 Johnson et al.
5,131,992 A 7/1992 Church et al.
5,200,595 A 4/1993 Boulos et al.
5,290,507 A 3/1994 Runkle
5,292,370 A 3/1994 Tsai et al.
5,376,475 A 12/1994 Ovshinsky et al.
5,395,453 A * 3/1995 Noda ................. H01J 37/32311
427/575
5,411,592 A 5/1995 Ovshinsky et al.
5,431,967 A 7/1995 Manthiram et al.
5,518,831 A 5/1996 Tou et al.
5,671,045 A 9/1997 Woskov et al.
5,676,919 A 10/1997 Kawamura et al.
5,750,013 A 5/1998 Lin
5,776,323 A 7/1998 Kobashi
5,876,684 A 3/1999 Withers et al.
5,909,277 A * 6/1999 Woskov ................. G01N 21/73
356/316
5,958,361 A 9/1999 Laine et al.
5,969,352 A 10/1999 French et al.
5,980,977 A 11/1999 Deng et al.
5,989,648 A 11/1999 Phillips
6,027,585 A 2/2000 Patterson et al.
6,200,651 B1 3/2001 Roche et al.
6,221,125 B1 4/2001 Soda et al.
6,261,484 B1 7/2001 Phillips et al.
6,274,110 B1 8/2001 Kim et al.
6,329,628 B1 12/2001 Kuo et al.
6,334,882 B1 1/2002 Aaslund
6,362,449 B1 3/2002 Hadidi et al.
6,376,027 B1 4/2002 Lee et al.
6,409,851 B1 6/2002 Sethuram et al.
6,428,600 B1 8/2002 Flurschuetz et al.
6,543,380 B1 4/2003 Sung-Spitzl
6,551,377 B1 4/2003 Leonhardt
6,569,397 B1 5/2003 Yadav et al.
6,579,573 B2 6/2003 Strutt et al.
6,589,311 B1 7/2003 Han et al.
6,607,693 B1 8/2003 Saito et al.
6,652,822 B2 11/2003 Phillips et al.
6,676,728 B2 1/2004 Han et al.
6,689,192 B1 2/2004 Phillips et al.
6,752,979 B1 6/2004 Talbot et al.
6,755,886 B2 6/2004 Phillips et al.
6,780,219 B2 8/2004 Singh et al.
6,793,849 B1 9/2004 Gruen et al.
6,805,822 B2 10/2004 Takei et al.
6,838,072 B1 1/2005 Kong et al.
6,869,550 B2 3/2005 Dorfman et al.
6,902,745 B2 6/2005 Lee et al.
6,919,257 B2 7/2005 Gealy et al.
6,919,527 B2 7/2005 Boulos et al.
6,989,529 B2 1/2006 Wiseman
7,066,980 B2 6/2006 Akimoto et al.
7,091,441 B1 8/2006 Kuo
7,108,733 B2 9/2006 Enokido
7,125,537 B2 10/2006 Liao et al.
7,125,822 B2 10/2006 Nakano et al.
7,175,786 B2 2/2007 Celikkaya et al.
7,182,929 B1 2/2007 Singhal et al.
7,220,398 B2 5/2007 Sutorik et al.
7,235,118 B2 6/2007 Bouaricha et al.
7,285,194 B2 10/2007 Uno et al.
7,285,307 B2 10/2007 Hohenthanner et al.
7,297,310 B1 11/2007 Peng et al.
7,297,892 B2 11/2007 Kelley et al.
7,344,776 B2 3/2008 Kollmann et al.
7,357,910 B2 4/2008 Phillips et al.
7,368,130 B2 5/2008 Kim et al.
7,374,704 B2 5/2008 Che et al.
7,375,303 B2 5/2008 Twarog
7,381,496 B2 6/2008 Onnerud et al.
7,431,750 B2 10/2008 Liao et al.
7,442,271 B2 10/2008 Asmussen et al.
7,491,468 B2 2/2009 Okada et al.
7,517,513 B2 4/2009 Sarkas et al.
7,524,353 B2 4/2009 Johnson et al.
7,534,296 B2 5/2009 Swain et al.
7,572,315 B2 8/2009 Boulos et al.
7,622,211 B2 11/2009 Vyas et al.
7,629,553 B2 12/2009 Fanson et al.
7,700,152 B2 4/2010 Laine et al.
7,776,303 B2 8/2010 Hung et al.
7,806,077 B2 10/2010 Lee et al.
7,828,999 B2 11/2010 Yubuta et al.
7,901,658 B2 3/2011 Weppner et al.
7,931,836 B2 4/2011 Xie et al.
7,939,141 B2 5/2011 Matthews et al.
8,007,691 B2 8/2011 Sawaki et al.
8,043,405 B2 10/2011 Johnson et al.
8,092,941 B2 1/2012 Weppner et al.
8,101,061 B2 1/2012 Suh et al.
8,168,128 B2 5/2012 Seeley et al.
8,178,240 B2 5/2012 Wang et al.
8,192,865 B2 6/2012 Buiel et al.
8,193,291 B2 6/2012 Zhang
8,211,388 B2 7/2012 Woodfield et al.
8,268,230 B2 9/2012 Cherepy et al.
8,283,275 B2 10/2012 Heo et al.
8,303,926 B1 11/2012 Luhrs et al.
8,329,090 B2 12/2012 Hollingsworth et al.
8,329,257 B2 12/2012 Larouche et al.
8,338,323 B2 12/2012 Takasu et al.
8,389,160 B2 3/2013 Venkatachalam et al.
8,420,043 B2 4/2013 Gamo et al.
8,439,998 B2 5/2013 Ito et al.
8,449,950 B2 5/2013 Shang et al.
8,478,785 B2 7/2013 Jamjoom et al.
8,492,303 B2 7/2013 Bulan et al.
8,529,996 B2 9/2013 Bocian et al.
8,592,767 B2 11/2013 Rappe et al.
8,597,722 B2 12/2013 Albano et al.
8,623,555 B2 1/2014 Kang et al.
8,658,317 B2 2/2014 Weppner et al.
8,685,593 B2 4/2014 Dadheech et al.
8,728,680 B2 5/2014 Mikhail et al.
8,735,022 B2 5/2014 Schlag et al.

(56) References Cited

U.S. PATENT DOCUMENTS

| | | | | |
|---|---|---|---|---|
| 8,748,785 | B2 * | 6/2014 | Jordan | B05B 7/226 219/121.36 |
| 8,758,957 | B2 | 6/2014 | Dadheech et al. | |
| 8,784,706 | B2 | 7/2014 | Shevchenko et al. | |
| 8,822,000 | B2 | 9/2014 | Kumagai et al. | |
| 8,840,701 | B2 | 9/2014 | Borland et al. | |
| 8,877,119 | B2 | 11/2014 | Jordan et al. | |
| 8,911,529 | B2 | 12/2014 | Withers et al. | |
| 8,919,428 | B2 | 12/2014 | Cola et al. | |
| 8,945,431 | B2 | 2/2015 | Schulz et al. | |
| 8,951,496 | B2 | 2/2015 | Hadidi et al. | |
| 8,956,785 | B2 | 2/2015 | Dadheech et al. | |
| 8,968,587 | B2 | 3/2015 | Shin et al. | |
| 8,968,669 | B2 | 3/2015 | Chen | |
| 8,980,485 | B2 | 3/2015 | Lanning et al. | |
| 8,999,440 | B2 | 4/2015 | Zenasni et al. | |
| 9,023,259 | B2 | 5/2015 | Hadidi et al. | |
| 9,051,647 | B2 | 6/2015 | Cooperberg et al. | |
| 9,065,141 | B2 | 6/2015 | Merzougui et al. | |
| 9,067,264 | B2 | 6/2015 | Moxson et al. | |
| 9,079,778 | B2 | 7/2015 | Kelley et al. | |
| 9,085,490 | B2 | 7/2015 | Taylor et al. | |
| 9,101,982 | B2 | 8/2015 | Aslund | |
| 9,136,569 | B2 | 9/2015 | Song et al. | |
| 9,150,422 | B2 | 10/2015 | Nakayama et al. | |
| 9,193,133 | B2 | 11/2015 | Shin et al. | |
| 9,196,901 | B2 | 11/2015 | Se-Hee et al. | |
| 9,196,905 | B2 | 11/2015 | Tzeng et al. | |
| 9,206,085 | B2 | 12/2015 | Hadidi et al. | |
| 9,242,224 | B2 | 1/2016 | Redjdal et al. | |
| 9,259,785 | B2 | 2/2016 | Hadidi et al. | |
| 9,293,302 | B2 | 3/2016 | Risby et al. | |
| 9,321,071 | B2 | 4/2016 | Jordan et al. | |
| 9,322,081 | B2 | 4/2016 | Mchugh et al. | |
| 9,352,278 | B2 | 5/2016 | Spatz et al. | |
| 9,356,281 | B2 | 5/2016 | Verbrugge et al. | |
| 9,368,772 | B1 | 6/2016 | Chen et al. | |
| 9,378,928 | B2 | 6/2016 | Zeng et al. | |
| 9,412,998 | B2 | 8/2016 | Rojeski et al. | |
| 9,421,612 | B2 | 8/2016 | Fang et al. | |
| 9,425,463 | B2 | 8/2016 | Hsu et al. | |
| 9,463,435 | B2 | 10/2016 | Schulz et al. | |
| 9,463,984 | B2 | 10/2016 | Sun et al. | |
| 9,520,593 | B2 | 12/2016 | Sun et al. | |
| 9,520,600 | B2 | 12/2016 | Dadheech et al. | |
| 9,624,565 | B2 | 4/2017 | Lee et al. | |
| 9,630,162 | B1 | 4/2017 | Sunkara et al. | |
| 9,643,891 | B2 | 5/2017 | Hadidi et al. | |
| 9,700,877 | B2 | 7/2017 | Kim et al. | |
| 9,705,136 | B2 | 7/2017 | Rojeski | |
| 9,718,131 | B2 | 8/2017 | Boulos et al. | |
| 9,735,427 | B2 | 8/2017 | Zhang | |
| 9,738,788 | B1 | 8/2017 | Gross et al. | |
| 9,751,129 | B2 | 9/2017 | Boulos et al. | |
| 9,767,990 | B2 | 9/2017 | Zeng et al. | |
| 9,768,033 | B2 | 9/2017 | Ranjan et al. | |
| 9,776,378 | B2 | 10/2017 | Choi | |
| 9,782,791 | B2 | 10/2017 | Redjdal et al. | |
| 9,782,828 | B2 | 10/2017 | Wilkinson | |
| 9,796,019 | B2 | 10/2017 | She et al. | |
| 9,796,020 | B2 | 10/2017 | Aslund | |
| 9,831,503 | B2 | 11/2017 | Sopchak | |
| 9,871,248 | B2 | 1/2018 | Rayner et al. | |
| 9,879,344 | B2 | 1/2018 | Lee et al. | |
| 9,899,674 | B2 | 2/2018 | Hirai et al. | |
| 9,917,299 | B2 | 3/2018 | Behan et al. | |
| 9,932,673 | B2 * | 4/2018 | Jordan | C23C 16/511 |
| 9,945,034 | B2 | 4/2018 | Yao et al. | |
| 9,947,926 | B2 | 4/2018 | Kim et al. | |
| 9,981,284 | B2 | 5/2018 | Guo et al. | |
| 9,991,458 | B2 | 6/2018 | Rosenman et al. | |
| 9,999,922 | B1 | 6/2018 | Struve | |
| 10,011,491 | B2 | 7/2018 | Lee et al. | |
| 10,050,303 | B2 | 8/2018 | Anandan et al. | |
| 10,057,986 | B2 | 8/2018 | Prud'Homme et al. | |
| 10,065,240 | B2 | 9/2018 | Chen | |
| 10,079,392 | B2 | 9/2018 | Huang et al. | |
| 10,116,000 | B1 | 10/2018 | Federici et al. | |
| 10,130,994 | B2 | 11/2018 | Fang et al. | |
| 10,167,556 | B2 | 1/2019 | Ruzic et al. | |
| 10,170,753 | B2 | 1/2019 | Ren et al. | |
| 10,193,142 | B2 | 1/2019 | Rojeski | |
| 10,244,614 | B2 | 3/2019 | Foret | |
| 10,279,531 | B2 | 5/2019 | Pagliarini | |
| 10,283,757 | B2 | 5/2019 | Noh et al. | |
| 10,319,537 | B2 | 6/2019 | Claussen et al. | |
| 10,333,183 | B2 | 6/2019 | Sloop | |
| 10,350,680 | B2 | 7/2019 | Yamamoto et al. | |
| 10,403,475 | B2 | 9/2019 | Cooperberg et al. | |
| 10,411,253 | B2 | 9/2019 | Tzeng et al. | |
| 10,439,206 | B2 | 10/2019 | Behan et al. | |
| 10,442,000 | B2 | 10/2019 | Fukada et al. | |
| 10,461,298 | B2 | 10/2019 | Herle | |
| 10,477,665 | B2 | 11/2019 | Hadidi et al. | |
| 10,493,524 | B2 | 12/2019 | She et al. | |
| 10,522,300 | B2 | 12/2019 | Yang | |
| 10,526,684 | B2 | 1/2020 | Ekman et al. | |
| 10,529,486 | B2 | 1/2020 | Nishisaka | |
| 10,543,534 | B2 | 1/2020 | Hadidi et al. | |
| 10,584,923 | B2 | 3/2020 | De et al. | |
| 10,593,985 | B2 | 3/2020 | Sastry et al. | |
| 10,610,929 | B2 | 4/2020 | Fang et al. | |
| 10,637,029 | B2 | 4/2020 | Gotlib Vainshtein et al. | |
| 10,638,592 | B2 | 4/2020 | Foret | |
| 10,639,712 | B2 | 5/2020 | Barnes et al. | |
| 10,647,824 | B2 | 5/2020 | Hwang et al. | |
| 10,655,206 | B2 | 5/2020 | Moon et al. | |
| 10,665,890 | B2 | 5/2020 | Kang et al. | |
| 10,668,566 | B2 | 6/2020 | Smathers et al. | |
| 10,669,437 | B2 | 6/2020 | Cox et al. | |
| 10,688,564 | B2 | 6/2020 | Boulos et al. | |
| 10,707,477 | B2 | 7/2020 | Sastry et al. | |
| 10,717,150 | B2 | 7/2020 | Aleksandrov et al. | |
| 10,727,477 | B2 | 7/2020 | Kim et al. | |
| 10,741,845 | B2 | 8/2020 | Yushin et al. | |
| 10,744,590 | B2 | 8/2020 | Maier et al. | |
| 10,756,334 | B2 | 8/2020 | Stowell et al. | |
| 10,766,787 | B1 | 9/2020 | Sunkara et al. | |
| 10,777,804 | B2 | 9/2020 | Sastry et al. | |
| 10,858,255 | B2 | 12/2020 | Koziol et al. | |
| 10,858,500 | B2 | 12/2020 | Chen et al. | |
| 10,892,477 | B2 | 1/2021 | Choi et al. | |
| 10,930,473 | B2 | 2/2021 | Paukner et al. | |
| 10,930,922 | B2 | 2/2021 | Sun et al. | |
| 10,943,744 | B2 | 3/2021 | Sungail et al. | |
| 10,944,093 | B2 | 3/2021 | Paz et al. | |
| 10,950,856 | B2 | 3/2021 | Park et al. | |
| 10,964,938 | B2 | 3/2021 | Rojeski | |
| 10,987,735 | B2 | 4/2021 | Hadidi et al. | |
| 10,998,552 | B2 | 5/2021 | Lanning et al. | |
| 11,031,641 | B2 | 6/2021 | Gupta et al. | |
| 11,050,061 | B2 | 6/2021 | Kim et al. | |
| 11,072,533 | B2 | 7/2021 | Shevchenko et al. | |
| 11,077,497 | B2 | 8/2021 | Motchenbacher et al. | |
| 11,077,524 | B2 | 8/2021 | Smathers et al. | |
| 11,108,050 | B2 | 8/2021 | Kim et al. | |
| 11,116,000 | B2 | 9/2021 | Sandberg et al. | |
| 11,130,175 | B2 | 9/2021 | Parrish et al. | |
| 11,130,994 | B2 | 9/2021 | Shachar et al. | |
| 11,133,495 | B2 | 9/2021 | Gazda et al. | |
| 11,148,202 | B2 | 10/2021 | Hadidi et al. | |
| 11,167,556 | B2 | 11/2021 | Shimada et al. | |
| 11,170,753 | B2 | 11/2021 | Nomura et al. | |
| 11,171,322 | B2 | 11/2021 | Seol et al. | |
| 11,183,682 | B2 | 11/2021 | Sunkara et al. | |
| 11,193,142 | B2 | 12/2021 | Angelidaki et al. | |
| 11,196,045 | B2 | 12/2021 | Dadheech et al. | |
| 11,219,884 | B2 | 1/2022 | Takeda et al. | |
| 11,244,614 | B2 | 2/2022 | He et al. | |
| 11,245,065 | B1 | 2/2022 | Ouderkirk et al. | |
| 11,245,109 | B2 | 2/2022 | Tzeng et al. | |
| 11,254,585 | B2 | 2/2022 | Ekman et al. | |
| 11,273,322 | B2 | 3/2022 | Zanata et al. | |
| 11,273,491 | B2 | 3/2022 | Barnes et al. | |

(56) References Cited

U.S. PATENT DOCUMENTS 11,299,397 B2 4/2022 Lanning et al.
11,311,937 B2 4/2022 Hadidi et al.
11,311,938 B2 4/2022 Badwe et al.
11,319,537 B2 5/2022 Dames et al.
11,333,183 B2 5/2022 Desai et al.
11,335,911 B2 5/2022 Lanning et al.
11,350,680 B2 6/2022 Rutkoski et al.
11,411,253 B2 8/2022 Busacca et al.
11,439,206 B2 9/2022 Santos
11,442,000 B2 9/2022 Vaez-Iravani et al.
11,461,298 B1 10/2022 Shemmer et al.
11,465,201 B2 10/2022 Barnes et al.
11,471,941 B2 10/2022 Barnes et al.
11,477,665 B2 10/2022 Franke et al.
11,577,314 B2 2/2023 Hadidi et al.
11,590,568 B2 2/2023 Badwe et al.
11,611,130 B2 3/2023 Wrobel et al.
11,633,785 B2 4/2023 Badwe et al.
11,654,483 B2 5/2023 Larouche et al.
11,717,886 B2 8/2023 Badwe et al.
11,839,919 B2 12/2023 Hadidi et al.
11,855,278 B2 12/2023 Holman et al.
2001/0016283 A1 8/2001 Shiraishi et al.
2001/0021740 A1 9/2001 Lodyga et al.
2002/0054912 A1 5/2002 Kim et al.
2002/0112794 A1 8/2002 Sethuram et al.
2003/0024806 A1 2/2003 Foret
2003/0027021 A1 2/2003 Sharivker et al.
2003/0070620 A1 4/2003 Cooperberg et al.
2003/0077398 A1 4/2003 Strutt et al.
2003/0129497 A1 7/2003 Yamamoto et al.
2003/0172772 A1 9/2003 Sethuram et al.
2003/0186128 A1 10/2003 Singh et al.
2003/0207978 A1 11/2003 Yadav et al.
2004/0013941 A1 1/2004 Kobayashi et al.
2004/0045807 A1 3/2004 Sarkas et al.
2004/0060387 A1 4/2004 Tanner-Jones
2004/0123699 A1 7/2004 Liao et al.
2005/0005844 A1 1/2005 Kitagawa et al.
2005/0025698 A1 2/2005 Talbot et al.
2005/0072496 A1 4/2005 Hwang et al.
2005/0163696 A1 7/2005 Uhm et al.
2005/0242070 A1 11/2005 Hammer
2005/0260786 A1 11/2005 Yoshikawa et al.
2006/0040168 A1 2/2006 Sridhar
2006/0141153 A1 6/2006 Kubota et al.
2006/0145124 A1 7/2006 Hsiao et al.
2006/0291827 A1 12/2006 Suib et al.
2007/0077350 A1 4/2007 Hohenthanner et al.
2007/0089860 A1 4/2007 Hou et al.
2007/0092432 A1 4/2007 Prud et al.
2007/0209758 A1 9/2007 Sompalli et al.
2007/0221635 A1 9/2007 Boulos et al.
2007/0259768 A1 11/2007 Kear et al.
2008/0029485 A1 2/2008 Kelley et al.
2008/0055594 A1* 3/2008 Hadidi .................... H05H 1/30 356/316
2008/0173641 A1* 7/2008 Hadidi .................... H05H 1/30 219/121.36
2008/0182114 A1 7/2008 Kim et al.
2008/0220244 A1 9/2008 Wai et al.
2008/0286490 A1 11/2008 Bogdanoff et al.
2008/0296268 A1 12/2008 Mike et al.
2008/0305025 A1 12/2008 Vitner et al.
2009/0074655 A1 3/2009 Suciu
2009/0093553 A1 4/2009 Kleine et al.
2009/0155689 A1 6/2009 Zaghib et al.
2009/0202869 A1 8/2009 Sawaki et al.
2009/0258255 A1 10/2009 Terashima et al.
2009/0304941 A1 12/2009 Mclean
2009/0305132 A1 12/2009 Gauthier et al.
2010/0007162 A1 1/2010 Han et al.
2010/0096362 A1 4/2010 Hirayama et al.
2010/0176524 A1 7/2010 Burgess et al.
2010/0219062 A1 9/2010 Leon Sanchez
2011/0005461 A1 1/2011 Vandermeulen
2011/0006254 A1 1/2011 Richard et al.
2012/0015284 A1 1/2012 Merzougui et al.
2012/0027955 A1 2/2012 Sunkara et al.
2012/0034135 A1 2/2012 Risby
2012/0048064 A1 3/2012 Kasper et al.
2012/0051962 A1 3/2012 Imam et al.
2012/0074342 A1 3/2012 Kim et al.
2012/0100438 A1 4/2012 Fasching et al.
2012/0112379 A1 5/2012 Beppu et al.
2012/0122017 A1 5/2012 Mills
2012/0224175 A1* 9/2012 Minghetti .......... G01N 21/6404 356/316
2012/0230860 A1 9/2012 Ward-Close et al.
2012/0240726 A1 9/2012 Kim et al.
2012/0294919 A1 11/2012 Jaynes et al.
2013/0032753 A1 2/2013 Yamamoto et al.
2013/0071284 A1 3/2013 Kano et al.
2013/0075390 A1* 3/2013 Ashida ............. H01J 37/32266 219/702
2013/0078508 A1 3/2013 Tolbert et al.
2013/0084474 A1 4/2013 Mills
2013/0087285 A1* 4/2013 Kofuji .............. H01J 37/32192 156/345.33
2014/0048516 A1 2/2014 Gorodetsky et al.
2014/0202286 A1 7/2014 Yokoyama et al.
2014/0271843 A1 9/2014 Ma et al.
2014/0272430 A1 9/2014 Kalayaraman
2014/0287162 A1* 9/2014 Jordan .................... B05B 7/226 427/575
2014/0322632 A1 10/2014 Sugimoto et al.
2014/0373344 A1 12/2014 Takada et al.
2015/0000844 A1 1/2015 Woo
2015/0101454 A1 4/2015 Shimizu et al.
2015/0167143 A1 6/2015 Luce et al.
2015/0171455 A1 6/2015 Mills
2015/0255767 A1 9/2015 Aetukuri et al.
2015/0259220 A1 9/2015 Rosocha et al.
2015/0270106 A1* 9/2015 Kobayashi ........ H01J 37/32935 315/34
2015/0333307 A1 11/2015 Thokchom et al.
2015/0342491 A1 12/2015 Marecki et al.
2015/0351652 A1 12/2015 Marecki et al.
2016/0028088 A1 1/2016 Romeo et al.
2016/0030359 A1 2/2016 Ma et al.
2016/0045841 A1 2/2016 Kaplan et al.
2016/0152480 A1 6/2016 Jang et al.
2016/0172163 A1* 6/2016 Kaneko ............. H01J 37/32211 315/34
2016/0189933 A1* 6/2016 Kobayashi ............ H05B 41/16 315/34
2016/0197341 A1 7/2016 Lu et al.
2016/0209043 A1 7/2016 Gao et al.
2016/0254540 A1 9/2016 Lee et al.
2016/0284519 A1* 9/2016 Kobayashi .......... H01J 37/3222
2016/0285090 A1 9/2016 Ozkan et al.
2016/0287113 A1 10/2016 Hebert et al.
2016/0308244 A1 10/2016 Badding et al.
2016/0332232 A1 11/2016 Forbes et al.
2016/0351910 A1 12/2016 Albano et al.
2016/0358757 A1* 12/2016 Ikeda ............... H01J 37/32266
2017/0009328 A1 1/2017 Germann et al.
2017/0070180 A1 3/2017 Mills
2017/0113935 A1 4/2017 Pennington et al.
2017/0120339 A1 5/2017 Aslund
2017/0125842 A1 5/2017 Meguro et al.
2017/0151609 A1 6/2017 Elsen et al.
2017/0176977 A1 6/2017 Huang et al.
2017/0179477 A1 6/2017 Walters et al.
2017/0209922 A1 7/2017 Kato et al.
2017/0338464 A1 11/2017 Fasching et al.
2017/0368604 A1 12/2017 Wilkinson
2017/0373344 A1 12/2017 Hadidi et al.
2018/0022928 A1 1/2018 Blush
2018/0025794 A1 1/2018 Lahoda et al.
2018/0083264 A1 3/2018 Soppe
2018/0104745 A1 4/2018 L'Esperance et al.
2018/0114677 A1* 4/2018 Komatsu ............ H01J 37/3244
2018/0126464 A1* 5/2018 Hadidi ................. B82B 3/0033

(56) References Cited

U.S. PATENT DOCUMENTS

2018/0130638 A1* 5/2018 Ahmad ............... B29C 65/5014
2018/0134629 A1 5/2018 Kolios et al.
2018/0138018 A1* 5/2018 Voronin ............ H01J 37/32302
2018/0159178 A1 6/2018 Weisenstein et al.
2018/0169763 A1 6/2018 Dorval et al.
2018/0214956 A1 8/2018 Larouche et al.
2018/0218883 A1* 8/2018 Iwao ................. H01L 21/67253
2018/0226229 A1 8/2018 Stowell et al.
2018/0241956 A1 8/2018 Suzuki
2018/0248175 A1 8/2018 Ghezelbash et al.
2018/0277826 A1 9/2018 Gayden et al.
2018/0277849 A1 9/2018 Gayden
2018/0294143 A1* 10/2018 Chua ................. H01J 37/32247
2018/0297122 A1* 10/2018 Hadidi ...................... B22F 9/14
2018/0346344 A1 12/2018 Chen et al.
2018/0353643 A1 12/2018 Ma et al.
2018/0363104 A1 12/2018 Fujieda et al.
2018/0366707 A1 12/2018 Johnson et al.
2018/0375149 A1 12/2018 Beck et al.
2019/0001416 A1 1/2019 Larouche et al.
2019/0061005 A1 2/2019 Kelkar
2019/0069944 A1 3/2019 Fischer
2019/0084290 A1 3/2019 Stoyanov et al.
2019/0088993 A1 3/2019 Ohta
2019/0125842 A1 5/2019 Grabowski
2019/0127835 A1 5/2019 Yang et al.
2019/0157045 A1* 5/2019 Meloni .................... H05H 1/46
2019/0160528 A1 5/2019 Mcgee et al.
2019/0165413 A1 5/2019 Furusawa
2019/0173130 A1 6/2019 Schuhmacher et al.
2019/0193151 A1 6/2019 Okumura et al.
2019/0218650 A1 7/2019 Subramanian et al.
2019/0271068 A1 9/2019 Sungail et al.
2019/0292441 A1 9/2019 Hill et al.
2019/0334206 A1 10/2019 Sastry et al.
2019/0341650 A9 11/2019 Lanning et al.
2019/0348202 A1 11/2019 Sachdev et al.
2019/0362936 A1 11/2019 Van Den Berg et al.
2019/0381564 A1* 12/2019 Barnes .................... C22C 14/00
2019/0389734 A1 12/2019 Dietz et al.
2020/0067128 A1 2/2020 Chmiola et al.
2020/0136176 A1 4/2020 Chen
2020/0149146 A1 5/2020 Chen et al.
2020/0153037 A1 5/2020 Renna et al.
2020/0198977 A1 6/2020 Hof et al.
2020/0203706 A1* 6/2020 Holman .............. H01M 4/0471
2020/0207668 A1 7/2020 Cavalli et al.
2020/0215606 A1* 7/2020 Barnes ...................... B22F 9/04
2020/0220222 A1 7/2020 Watarai et al.
2020/0223704 A1 7/2020 Neale et al.
2020/0227728 A1 7/2020 Huang et al.
2020/0254432 A1 8/2020 Shirman et al.
2020/0276638 A1 9/2020 King et al.
2020/0288561 A1 9/2020 Huh
2020/0314991 A1 10/2020 Duanmu et al.
2020/0335754 A1 10/2020 Ramasubramanian et al.
2020/0335781 A1 10/2020 Oshita et al.
2020/0350565 A1 11/2020 Oshita et al.
2020/0358093 A1 11/2020 Oshita et al.
2020/0358096 A1 11/2020 Paulsen et al.
2020/0381217 A1* 12/2020 Kraus ............... C23C 16/45544
2020/0388857 A1 12/2020 Sunkara et al.
2020/0391295 A1 12/2020 Dorval et al.
2020/0395607 A1 12/2020 Tzeng
2020/0402768 A1 12/2020 Stowell et al.
2020/0407858 A1 12/2020 Sano et al.
2021/0002759 A1* 1/2021 Zhang ............... H01J 37/32192
2021/0024358 A1 1/2021 Chae et al.
2021/0047186 A1 2/2021 Ifuku et al.
2021/0057191 A1* 2/2021 Stowell ............ H01J 37/32201
2021/0075000 A1 3/2021 Holman et al.
2021/0078072 A1* 3/2021 Barnes .................... B22F 1/142
2021/0085468 A1 3/2021 Ryd et al.
2021/0098826 A1 4/2021 Chung et al.
2021/0129216 A1* 5/2021 Barnes .................... B22F 1/142
2021/0139331 A1 5/2021 Kang et al.
2021/0187614 A1 6/2021 Tsubota et al.
2021/0226302 A1 7/2021 Lanning et al.
2021/0253430 A1 8/2021 Zaplotnik et al.
2021/0273217 A1 9/2021 Park et al.
2021/0273292 A1 9/2021 Yun et al.
2021/0276094 A1 9/2021 Sobu et al.
2021/0296731 A1 9/2021 Wrobel et al.
2021/0308753 A1 10/2021 Larouche et al.
2021/0310110 A1 10/2021 Stowell et al.
2021/0339313 A1 11/2021 Motchenbacher et al.
2021/0344059 A1 11/2021 Ekman et al.
2021/0367264 A1 11/2021 Hadidi et al.
2021/0408533 A1 12/2021 Holman et al.
2022/0041457 A1 2/2022 Pullen et al.
2022/0095445 A1* 3/2022 Shang .................... B33Y 40/10
2022/0118517 A1 4/2022 Hadidi et al.
2022/0127145 A1 4/2022 Ding et al.
2022/0134430 A1 5/2022 Larouche et al.
2022/0134431 A1 5/2022 Badwe et al.
2022/0143693 A1 5/2022 Larouche et al.
2022/0209298 A1 6/2022 Kim et al.
2022/0223379 A1 7/2022 Holman et al.
2022/0228288 A1* 7/2022 Holman .................. C30B 29/22
2022/0267216 A1* 8/2022 Holman .............. C04B 35/6265
2022/0314325 A1* 10/2022 Badwe ...................... B22F 1/05
2022/0324022 A1 10/2022 Badwe
2022/0352549 A1 11/2022 Kim et al.
2023/0001375 A1* 1/2023 Kozlowski ............. B01J 19/126
2023/0001376 A1* 1/2023 Kozlowski ............. B01J 19/088
2023/0032362 A1* 2/2023 Holman ................... C01G 1/02
2023/0144075 A1 5/2023 Badwe et al.
2023/0211407 A1 7/2023 Hadidi
2023/0219134 A1* 7/2023 Houshmand .............. C22C 9/00
75/346
2023/0245896 A1 8/2023 Gupta et al.
2023/0247751 A1* 8/2023 Kozlowski ............. C23C 4/134
118/620
2023/0298885 A1 9/2023 Borude et al.
2023/0330747 A1 10/2023 Barnes et al.
2023/0330748 A1 10/2023 Badwe et al.
2023/0377848 A1 11/2023 Holman et al.
2024/0017322 A1 1/2024 Badwe et al.

FOREIGN PATENT DOCUMENTS

CA 2947531 A1 11/2015
CN 1188073 A 7/1998
CN 1653869 A 8/2005
CN 1675785 A 9/2005
CN 1967911 A 5/2007
CN 101191204 A 6/2008
CN 101391307 A 3/2009
CN 101728509 A 6/2010
CN 101804962 A 8/2010
CN 101716686 B 2/2011
CN 102179521 A 9/2011
CN 102328961 A 1/2012
CN 102394290 A 3/2012
CN 102412377 A 4/2012
CN 102427130 A 4/2012
CN 102664273 A 9/2012
CN 102723502 A 10/2012
CN 102867940 A 1/2013
CN 102983312 A 3/2013
CN 103121105 A 5/2013
CN 103402921 A 11/2013
CN 102554242 B 12/2013
CN 103456926 A 12/2013
CN 103682372 A 3/2014
CN 103682383 A 3/2014
CN 103700815 A 4/2014
CN 103874538 A 6/2014
CN 103956520 A 7/2014
CN 104064736 A 9/2014
CN 104084592 A 10/2014
CN 104209526 A 12/2014
CN 104218213 A 12/2014
CN 204156003 U 2/2015

(56) References Cited

FOREIGN PATENT DOCUMENTS

CN 104485452 A 4/2015
CN 104752734 A 7/2015
CN 104772473 A 7/2015
CN 103515590 B 9/2015
CN 105514373 A 4/2016
CN 106001597 A 10/2016
CN 106044777 A 10/2016
CN 106159316 A 11/2016
CN 106216703 A 12/2016
CN 106450146 A 2/2017
CN 106493350 A 3/2017
CN 206040854 U 3/2017
CN 106684387 A 5/2017
CN 106756417 A 5/2017
CN 106784692 A 5/2017
CN 107093732 A 8/2017
CN 107170973 A 9/2017
CN 107579241 A 1/2018
CN 107931622 A 4/2018
CN 108134104 A 6/2018
CN 108145170 A 6/2018
CN 108217612 A 6/2018
CN 108649190 A 10/2018
CN 108666563 A 10/2018
CN 108672709 A 10/2018
CN 108878862 A 11/2018
CN 108907210 A 11/2018
CN 108933239 A 12/2018
CN 108963239 A 12/2018
CN 109167070 A 1/2019
CN 109301212 A 2/2019
CN 109616622 A 4/2019
CN 109742320 A 5/2019
CN 109808049 A 5/2019
CN 109888233 A 6/2019
CN 110153434 A 8/2019
CN 110218897 A 9/2019
CN 110299516 A 10/2019
CN 110790263 A 2/2020
CN 110993908 A 4/2020
CN 111099577 A 5/2020
CN 111342163 A 6/2020
CN 111370751 A 7/2020
CN 111403701 A 7/2020
CN 111515391 A 8/2020
CN 111970807 A 11/2020
CN 112259740 A 1/2021
CN 112331947 A 2/2021
CN 112397706 A 2/2021
CN 112421006 A 2/2021
CN 112421048 A 2/2021
CN 112447977 A 3/2021
CN 112768709 A 5/2021
CN 112768710 A 5/2021
CN 112768711 A 5/2021
CN 112864453 A 5/2021
CN 113097487 A 7/2021
CN 113104838 A 7/2021
CN 113764688 A 12/2021
CN 113871581 A 12/2021
CN 114388822 A 4/2022
CN 114744315 A 7/2022
CN 114824297 A 7/2022
CN 115394976 A 11/2022
DE 10335355 A1 11/2004
DE 102009033251 A1 9/2010
DE 102010006440 A1 8/2011
DE 102011109137 A1 2/2013
DE 102018132896 A1 6/2020
EP 0256233 A2 2/1988
EP 2292557 A1 3/2011
EP 3143838 A1 3/2017
EP 3474978 A1 5/2019
FR 2525122 A1 10/1983
FR 2591412 A1 6/1987
GB 2595745 A 12/2021
GB 2620597 A 1/2024
IN 202117004272 3/2021
IN 202011017775 10/2021
JP 63-243212 A 10/1988
JP 10-172564 A 6/1998
JP 10-296446 A 11/1998
JP 11-064556 A 3/1999
JP 2001-064703 A 3/2001
JP 2001-504753 A 4/2001
JP 2001-348296 A 12/2001
JP 2002-249836 A 9/2002
JP 2002-332531 A 11/2002
JP 2004-034014 A 2/2004
JP 2004-505761 A 2/2004
JP 2004-193115 A 7/2004
JP 2004-232084 A 8/2004
JP 2004-311297 A 11/2004
JP 2004-340414 A 12/2004
JP 2004-362895 A 12/2004
JP 2005-015282 A 1/2005
JP 2005-072015 A 3/2005
JP 2005-076052 A 3/2005
JP 2005-135755 A 5/2005
JP 2005-187295 A 7/2005
JP 2005-222956 A 8/2005
JP 2005-272284 A 10/2005
JP 2006-040722 A 2/2006
JP 2007-113120 A 5/2007
JP 2007-138287 A 6/2007
JP 2007-149513 A 6/2007
JP 2007-238402 A 9/2007
JP 2008-230905 A 10/2008
JP 2008-243447 A 10/2008
JP 2009-187754 A 8/2009
JP 2010-024506 A 2/2010
JP 2010-097914 A 4/2010
JP 2011-108406 A 6/2011
JP 2011-222323 A 11/2011
JP 2011-258348 A 12/2011
JP 2012-046393 A 3/2012
JP 2012-151052 A 8/2012
JP 2012-234788 A 11/2012
JP 2013-062242 A 4/2013
JP 2013-063539 A 4/2013
JP 2013-076130 A 4/2013
JP 2013069602 A * 4/2013 ........ H01J 37/32266
JP 2015-048269 A 3/2015
JP 2015-122218 A 7/2015
JP 2016-029193 A 3/2016
JP 2016-047961 A 4/2016
JP 6103499 B2 3/2017
JP 2017-524628 A 8/2017
JP 2018-141762 A 9/2018
JP 2018-528328 A 9/2018
JP 2018-190563 A 11/2018
JP 2019-055898 A 4/2019
JP 2019-516020 A 6/2019
JP 2019-112699 A 7/2019
JP 2019-520894 A 7/2019
JP 2020-121898 A 8/2020
JP 2021-061089 A 4/2021
JP 2021-061090 A 4/2021
JP 2021-116191 A 8/2021
JP 2022-530649 A 6/2022
KR 10-0582507 B1 5/2006
KR 10-2007-0076686 A 7/2007
KR 10-2009-0070140 A 7/2009
KR 10-1133094 B1 4/2012
KR 10-2014-0001813 U 3/2014
KR 10-1684219 B1 12/2016
KR 10-2017-0039922 A 4/2017
KR 10-2017-0045181 A 4/2017
KR 10-2018-0001799 A 1/2018
KR 10-2018-0035750 A 4/2018
KR 10-1907912 B1 10/2018
KR 10-1907916 B1 10/2018
KR 10-1923466 B1 11/2018
KR 10-2101006 B1 4/2020

(56) References Cited

FOREIGN PATENT DOCUMENTS

| | | | |
|---|---|---|---|
| KR | 10-2124946 | B1 | 6/2020 |
| KR | 10-2020-0131751 | A | 11/2020 |
| KR | 10-2021-0057253 | A | 5/2021 |
| RU | 2744449 | C1 | 3/2021 |
| TW | 521539 | B | 2/2003 |
| TW | 200823313 | A | 6/2008 |
| TW | I329143 | B | 8/2010 |
| TW | 201112481 | A | 4/2011 |
| TW | 201225389 | A | 6/2012 |
| TW | 201310758 | A | 3/2013 |
| TW | 201411922 | A | 3/2014 |
| TW | I593484 | B | 8/2017 |
| WO | 03/77333 | A1 | 9/2003 |
| WO | 2004/054017 | A1 | 6/2004 |
| WO | 2004/089821 | A1 | 10/2004 |
| WO | 2005/039752 | A1 | 5/2005 |
| WO | 2006/100837 | A1 | 9/2006 |
| WO | 2010/095726 | A1 | 8/2010 |
| WO | 2011/082596 | A1 | 7/2011 |
| WO | 2011/090779 | A2 | 7/2011 |
| WO | 2012/023858 | A1 | 2/2012 |
| WO | 2012/114108 | A1 | 8/2012 |
| WO | 2012/144424 | A1 | 10/2012 |
| WO | 2012/162743 | A1 | 12/2012 |
| WO | 2013/017217 | A1 | 2/2013 |
| WO | 2014/011239 | A2 | 1/2014 |
| WO | 2014/110604 | A2 | 7/2014 |
| WO | 2014/153318 | A1 | 9/2014 |
| WO | 2015/064633 | A1 | 5/2015 |
| WO | 2015/174949 | A1 | 11/2015 |
| WO | 2015/187389 | A2 | 12/2015 |
| WO | 2016/048862 | A1 | 3/2016 |
| WO | 2016/082120 | A1 | 6/2016 |
| WO | 2016/091957 | A1 | 6/2016 |
| WO | 2017/074081 | A1 | 5/2017 |
| WO | 2017/074084 | A1 | 5/2017 |
| WO | 2017/080978 | A1 | 5/2017 |
| WO | 2017/091543 | A1 | 6/2017 |
| WO | 2017/106601 | A8 | 7/2017 |
| WO | 2017/118955 | A1 | 7/2017 |
| WO | 2017/130946 | A1 | 8/2017 |
| WO | 2017/158349 | A1 | 9/2017 |
| WO | 2017/177315 | A1 | 10/2017 |
| WO | 2017/178841 | A1 | 10/2017 |
| WO | 2017/223482 | A1 | 12/2017 |
| WO | 2018/133429 | A1 | 7/2018 |
| WO | 2018/141082 | A1 | 8/2018 |
| WO | 2018/145750 | A1 | 8/2018 |
| WO | 2019/045923 | A1 | 3/2019 |
| WO | 2019/052670 | A1 | 3/2019 |
| WO | 2019/095039 | A1 | 5/2019 |
| WO | 2019/124344 | A1 | 6/2019 |
| WO | 2019/139773 | A1 | 7/2019 |
| WO | 2019/178668 | A1 | 9/2019 |
| WO | 2019/243870 | A1 | 12/2019 |
| WO | 2019/246242 | A1 | 12/2019 |
| WO | 2019/246257 | A1 | 12/2019 |
| WO | 2020/009955 | A1 | 1/2020 |
| WO | 2020/013667 | A1 | 1/2020 |
| WO | 2020/041767 | A1 | 2/2020 |
| WO | 2020/041775 | A1 | 2/2020 |
| WO | 2020/091854 | A1 | 5/2020 |
| WO | 2020/132343 | A1 | 6/2020 |
| WO | 2020/223358 | A1 | 11/2020 |
| WO | 2020/223374 | A1 | 11/2020 |
| WO | 2021/029769 | A1 | 2/2021 |
| WO | 2021/046249 | A1 | 3/2021 |
| WO | 2021/085670 | A1 | 5/2021 |
| WO | 2021/115596 | A1 | 6/2021 |
| WO | 2021/118762 | A1 | 6/2021 |
| WO | 2021/127132 | A1 | 6/2021 |
| WO | 2021/159117 | A1 | 8/2021 |
| WO | 2021/191281 | A1 | 9/2021 |
| WO | 2021/245410 | A1 | 12/2021 |
| WO | 2021/245411 | A1 | 12/2021 |
| WO | 2021/263273 | A1 | 12/2021 |
| WO | 2022/005999 | A1 | 1/2022 |
| WO | 2022/032301 | A1 | 2/2022 |
| WO | 2022/043701 | A1 | 3/2022 |
| WO | 2022/043702 | A1 | 3/2022 |
| WO | 2022/043704 | A1 | 3/2022 |
| WO | 2022/043705 | A1 | 3/2022 |
| WO | 2022/067303 | A1 | 3/2022 |
| WO | 2022/075846 | A1 | 4/2022 |
| WO | 2022/107907 | A1 | 5/2022 |
| WO | 2022/133585 | A1 | 6/2022 |
| WO | 2022/136699 | A1 | 6/2022 |
| WO | 2023/022492 | A1 | 2/2023 |

OTHER PUBLICATIONS

"High-entropy alloy", Wikipedia, webpage last edited Dec. 29, 2022 (accessed Jan. 17, 2023), in 16 pages. URL: https://en.wikipedia.org/wiki/High-entropy_alloy.

Ajayi, B. et al., "A rapid and scalable method for making mixed metal oxide alloys for enabling accelerated materials discovery", Journal of Materials Research, Jun. 2016, vol. 31, No. 11, pp. 1596-1607.

Ajayi, B. P. et al., "Atmospheric plasma spray pyrolysis of lithiated nickel-manganese-cobalt oxides for cathodes in lithium-ion batteries", Chemical Engineering Science, vol. 174, Sep. 14, 2017, pp. 302-310.

Ali, M. et al., Spray Flame Synthesis (SFS) of Lithium Lanthanum Zirconate (LLZO) Solid Electrolyte, Materials, vol. 14, No. 13, 2021, pp. 1-13.

Barbis et al., "Titanium powders from the hydride-dehydride process." Titanium Powder Metallurgy. Butterworth-Heinemann, 2015. pp. 101-116.

Bardos, L., et al., "Differences between microwave and RF activation of nitrogen for the PECVD process", J. Phys. D: Appl. Phys., vol. 15, 1982, pp. 79-82.

Bardos, L., et al., "Microwave Plasma Sources and Methods in Processing Technology", IEEE Press, 2022, 10 pages.

Bobzin, K. et al., "Modelling and Diagnostics of Multiple Cathodes Plasma Torch System for Plasma Spraying", Frontiers of Mechanical Engineering, Sep. 2011, vol. 6, pp. 324-331.

Bobzin, K. et al., "Numerical and Experimental Determination of Plasma Temperature during Air Plasma Spraying with a Multiple Cathodes Torch", Journal of Materials Processing Technology, Oct. 2011, vol. 211, pp. 1620-1628.

Boulos, M. I., "The inductively coupled radio frequency plasma." Journal of High Temperature Material Process, Jan. 1997, vol. 1, pp. 17-39.

Boulos, M., "Induction Plasma Processing of Materials for Powders, Coatings, and Near-Net-Shape Parts", Advanced Materials & Processes, Aug. 2011, pp. 52-53, in 3 pages.

Boulos, M., "Plasma power can make better powders", Metal Powder Report, May 2004, vol. 59(5), pp. 16-21.

Carreon, H. et al., "Study of Aging Effects in a Ti—6AL—4V alloy with Widmanstatten and Equiaxed Microstructures by Non-destructive Means", AIP Conference Proceedings 1581, 2014 (published online Feb. 17, 2015), pp. 739-745.

Chang, S. et al., "One-Step Fast Synthesis of Li4Ti5012 Particles Using an Atmospheric Pressure Plasma Jet", Journal of the American Ceramic Society, Dec. 26, 2013, vol. 97, No. 3, pp. 708-712.

Chau, J. L. K. et al. "Microwave Plasma Production of Metal Nanopowders," Jun. 12, 2014, Inorganics, vol. 2, pp. 278-290 (Year: 2014).

Chen, G. et al., "Spherical Ti—6Al—4V Powders Produced by Gas Atomization", Key Engineering Materials, vol. 704, Aug. 2016, pp. 287-292. URL: https://www.scientific.net/KEM.704.287.

Chen, Z., et al., "Advanced cathode materials for lithium-ion batteries", MRS Bulletin, vol. 36, No. 7, Jul. 2011, pp. 498-505.

Chikumba et al., "High Entropy Alloys: Development and Applications" 7th International Conference on Latest Trends in Engineering & Technology (ICLTET'2015) Nov. 26-27, 2015 Irene, Pretoria (South Africa).

(56) References Cited

OTHER PUBLICATIONS

Choi, S. I., et al., "Continuous process of carbon nanotubes synthesis by decomposition of methane using an arc-jet plasma", Thin Solid Films, 2006, vol. 506-507, 2006, pp. 244-249.
Coldwell, D. M. et al., "The reduction of SiO.sub.2 with Carbon in a Plasma", Journal of Electrochemical Society, Jan. 1977, vol. 124, pp. 1686-1689.
Dearmiti, C., "26. Functional Fillers for Plastics", in Applied Plastics Engineering Handbook—Processing and Materials, ed., Myer Kuiz, Elsevier, 2011, pp. 455-468.
Ding, F., et al., "Nucleation and Growth of Single-Walled Carbon Nanotubes: A Molecular Dynamics Study", J. Phys. Chem. B, vol. 108, 2004, pp. 17369-17377.
Dolbec, R., "Recycling Spherical Powders", Presented at Titanium 2015, Orlando, FL, Oct. 2015, in 20 pages.
Eremin, A., et al., "The Role of Methyl Radical in Soot Formation", Combustion Science and Technology, vol. 191, No. 12, 2008, pp. 2226-2242.
Finckle, J. R., et al., "Plasma Pyrolysis of Methane to Hydrogen and Carbon Black", Industrial Engineering and Chemical Research, 2002. vol. 41, No. 6, 2002, pp. 1425-1435.
Fu, D., et al., "Direct synthesis of Y-junction carbon nanotubes by microwave-assisted pyrolysis of methane", Materials Chemistry and Physics, vol. 118, vol. 2-3, 2009, pp. 501-505.
Fuchs, G.E. et al., "Microstructural evaluation of as-solidified and heat-treated y-TiAl based powders", Materials Science and Engineering, 1992, A152, pp. 277-282.
Gleiman, S. et al., "Melting and spheroidization of hexagonal boron nitride in a microwave-powered, atmospheric pressure nitrogen plasma", Journal of Materials Science, Aug. 2002, vol. 37(16), pp. 3429-3440.
Grace, J. et al., "Connecting particle sphericity and circularity", Particuology, vol. 54, 2021, pp. 1-4, ISSN 1674-2001, https://doi .org/10.1016/j.partic.2020.09.006. (Year: 2020).
Gradl, P. et al., "GRCop-42 Development and Hot-fire Testing Using Additive Manufacturing Powder Bed Fusion for Channel-Cooled Combustion Chambers", 55th AIAA/SAE/ASEE Joint Propulsion Conference 2019, Aug. 2019, pp. 1-26.
Haghighatpanah, S., et al., "Computational studies of catalyst-free single walled carbon nanotube growth", J Chem Phys, vol. 139, No. 5, 10 pages.
Haneklaus, N., et al., "Stop Smoking—Tube-In-Tube Helical System for Flameless Calcination of Minerals", Processes, vol. 5, No. 4, 2017, pp. 1-12.
He et al., "A precipitation-hardened high-entropy alloy with outstanding tensile properties" Acta Materialia 102, Jan. 2016, pp. 187-196.
Houmes et al., "Microwave Synthesis of Ternary Nitride Materials", Journal of Solid State Chemistry, vol. 130, Issue 2, May 1997, pp. 266-271.
Huo, H., et al., "Composite electrolytes of polyethylene oxides/garnets interfacially wetted by ionic liquid for room-temperature solid-state lithium battery", Journal of Power Sources, vol. 372, 2017, pp. 1-7.
Ivasishin, et al., "Innovative Process for Manufacturing Hydrogenated Titanium Powder for Solid State Production of R/M Titanium Alloy Components" Titanium 2010, Oct. 3-6, 2010, 27 pages.
Jasinski, M., et al., "Atmospheric pressure microwave plasma source for hydrogen production", International Journal of Hydrogen Energy, vol. 38, Issue 26, 2013, pp. 11473-11483.
Jia, H. et al., "Hierarchical porous silicon structures with extraordinary mechanical strength as high-performance lithium-ion battery anodes", Nature Communications, Mar. 2020, vol. 11, in 9 pages. URL: https://doi.ora/10.1038/s41467-020-15217-9.
Kassel, L. S., "The Thermal Decomposition of Methane", Journal of the American Chemical Society, vol. 54, No. 10, 1932, pp. 3949-3961.
Kerscher, F., et al., "Low-carbon hydrogen production via electron beam plasma methane pyrolysis: Techno-economic analysis and carbon footprint assessment", International Journal of Hydrogen Energy, vol. 46, Issue 38, 2021, pp. 19897-19912.
Kim, H., et al., "Three-Dimensional Porous Silicon Particles for Use in High-Performance Lithium Secondary Batteries", Angewandte Chemie International Edition, vol. 47, No. 2, Dec. 15, 2008, pp. 10151-10154.
Kim, S. et al., "Thermodynamic Evaluation of Oxygen Behavior in Ti Powder Deoxidized by Ca Reductant", Met. Mater. Int., 2016, vol. 22, pp. 658-662.
Ko, M. et al., "Challenges in Accommodating Volume Change of Si Anodes for Li-Ion Batteries", Chem Electro Chem, Aug. 2015, vol. 2, pp. 1645-1651. URL: https://doi.org/10.1002/celc.201500254.
Kotlyarov, V. I. et al, "Production of Spherical Powders on the Basis of Group IV Metals for Additive Manufacturing", Inorganic Materials: Applied Research, Pleiades Publishing, May 2017, vol. 8, No. 3, pp. 452-458.
Laine, R. M. et al., "Making nanosized oxide powders from precursors by flame spray pyrolysis", Key Engineering Materials, Jan. 1999, vol. 159-160, pp. 17-24.
Lee, D. H., et al., "Comparative Study of Methane Activation Process by Different Plasma Sources", Plasma Chem. Plasma Process., vol. 33, No. 4, 2013, pp. 647-661.
Lee, D. H., et al., "Mapping Plasma Chemistry in Hydrocarbon Fuel Processing Processes", Plasma Chem. Plasma Process., vol. 33, No. 1, 2013, pp. 249-269.
Li, L. et al., "Spheroidization of silica powders by radio frequency inductively coupled plasma with Ar—H2 and Ar—N2 as the sheath gases at atmospheric pressure", International Journal of Minerals, Metallurgy, and Materials, Sep. 2017, vol. 24(9), pp. 1067-1074.
Li, X. et al., "Mesoporous silicon sponge as an anti-pulverization structure for high-performance lithium-ion battery anodes", Nature Communications, Jul. 2014, vol. 5, Article No. 4105, in 7 pages. URL: httDs://doi.org/10.1038/ncomms5105.
Li, Z. et al., "Strong and Ductile Non-Equicaloric High-Entropy Alloys: Design, Processing, Microstructure, and Mechanical Properties", The Journal of the Minerals, Metals & Materials Society, Aug. 2017, vol. 69(1), pp. 2099-2106. URL: https://doi.org/10.1007/s11837-017-2540-2.
Lin, M., "Gas Quenching with Air Products' Rapid Gas Quenching Gas Mixture", Air Products, Dec. 31, 2007, in 4 pages. URL: hllps://www.airproducts.co.uk/-/media/airproducls/liles/en/330/330-07-085-us-gas-quenching-wilh-air-products-rapid-Jas-quenching-gas-mixture.pdf.
Liu, Y., et al., "Advances of microwave plasma-enhanced chemical vapor deposition in fabrication of carbon nanotubes: a review", J Mater Sci., vol. 55, 2021, pp. 12559-12583.
Majewksi, T., "Investigation of W—Re—Ni heavy alloys produced from plasma spheroidized powders", Solid State Phenomena, Mar. 2013, vol. 199, pp. 448-453.
Moisan, M. et al., "Waveguide-Based Single and Multiple Nozzle Plasma Torches: the Tiago Concept", Plasma Sources Science and Technology, Jun. 2001, vol. 10, pp. 387-394.
Moldover, M. R. et al., "Measurement of the Universal Gas Constant R Using a Spherical Acoustic Resonator", Physical Review Letters, Jan. 1988, vol. 60(4), pp. 249-252.
Muoio, C. et al., "Phase Homogeneity in Y2O3—MgO Nanocomposites Synthesized by Thermal Decomposition of Nitrate Precursors with Ammonium Acetate Additions" J. Am. Ceram. Soc., 94[12] 4207-4217, 2011.
Murugan et al. "Nanostructured a/β-tungsten by reduction of WO3 under microwave plasma", Int. Journal of Refractory Metals and Hard Materials 29 (2011) 128-133. (Year: 2011).
Nichols, F. A., "On the spheroidization of rod-shaped particles of finite length", Journal of Materials Science, Jun. 1976, vol. 11, pp. 1077-1082.
Nyutu, E. et al., "Ultrasonic Nozzle Spray in Situ Mixing and Microwave-Assisted Preparation of Nanocrystalline Spinel Metal Oxides: Nickel Ferrite and Zinc Aluminate", Journal of Physical Chemistry C, Feb. 1, 2008, vol. 112, No. 5, pp. 1407-1414.
Ohta, R. et al., "Effect of PS-PVD production throughput on Si nanoparticles for negative electrode of lithium ion batteries", Journal of Physics D: Applied Physics, Feb. 2018, vol. 51(1), in 7 pages.

(56) References Cited

OTHER PUBLICATIONS

Olsvik, O., et al, "Thermal Coupling of Methane—A Comparison Between Kinetic Model Data and Experimental Data", Thermochimica Acta., vol. 232, No. 1, 1994, pp. 155-169.
Or, T. et al., "Recycling of mixed cathode lithium-ion batteries for electric vehicles: Current status and future outlook", Carbon Energy, Jan. 2020, vol. 2, pp. 6-43. URL: https://doi.org/10.1002/cey2.29.
Park et al. "Preparation of spherical WTaMoNbV refractory high entropy alloy powder by inductively-coupled thermal plasma", Materials Letters 255 (2019) 126513 (Year: 2019).
Popescu et al.. "New TiZrNbTaFe high entropy alloy used for medical applications" IOP Conference Series: Materials Science and Engineering 400. Mod Tech 2018 (2018), 9 pages.
Pulsation Reactors—Thermal Processing for Extraordinary Material Properties, retrieved from https://www.ibu-tec.com/facilities/pulsation-reactors/, retrieved on Mar. 18, 2023, pp. 5.
Reig, L. et al., "Microstructure and Mechanical Behavior of Porous Ti—6Al—4V Processed by Spherical Powder Sintering", Materials, Oct. 23, 2013, vol. 6, pp. 4868-4878.
Sastry, S.M.L. et al., "Rapid Solidification Processing of Titanium Alloys", Journal of Metals (JOM), Sep. 1983, vol. 35, pp. 21-28.
Savage, S. J. et al., "Production of rapidly solidified metals and alloys", Journal of Metals (JOM), Apr. 1984, vol. 36, pp. 20-33.
Sheng, Y. et al., "Preparation of Micro-spherical Titanium Powder by RF Plasma", Rare Metal Materials and Engineering, Jun. 2013, vol. 42, No. 6, pp. 1291-1294.
Sheng, Y. et al., "Preparation of Spherical Tungsten Powder by RF Induction Plasma", Rare Metal Materials and Engineering, Nov. 2011, vol. 40, No. 11, pp. 2033-2037.
Suryanarayana, C. et al., "Rapid solidification processing of titanium alloys", International Materials Reviews, 1991, vol. 36, pp. 85-123.
Suryanarayana, C., "Recent Developments in Mechanical Alloying", Reviews on Advanced Materials Science, Aug. 2008, vol. 18(3), pp. 203-211.
Tang, H. P. et al., "Effect of Powder Reuse Times on Additive Manufacturing of Ti—6Al—4V by Selective Electron Beam Melting", JOM, Mar. 2015, vol. 67, pp. 555-563.
Taylor G, et al.; "Reduction of Metal Oxides by Hydrogen", 1930, vol. 52 (Year: 1930).
Van Laar, J. H. et al., "Spheroidization of Iron Powder in a Microwave Plasma Reactor", Journal of the Southern African Institute of Mining and Metallurgy, Oct. 2016, vol. 116, No. 10, pp. 941-946.
Veith et al., "Low temperature synthesis of nanocrystalline Y3Al5012 (YAG) and Cedoped Y3Al5012 via different sol-gel methods." J. Maler Chem, (1999) 9: 3069-3079.
Walter et al., "Microstructural and mechanical characterization of sol gel-derived Si—O—C glasses" Journal of the European Ceramic Society, vol. 22, Issue 13, Dec. 2002, pp. 2389-2400.
Wang, H., et al., "A detailed kinetic modeling study of aromatics formation in laminar premixed acetylene and ethylene flames" Combustion and Flame, vol. 110, No. 1-2, 1997, pp. 173-221.
Wang, J. et al., "Preparation of Spherical Tungsten and Titanium Powders by RF Induction Plasma Processing", Rare Metals, Jun. 2015 (published online May 31, 2014), vol. 34, No. 6, pp. 431-435.
Wang, Y. et al., "Developments in Nanostructured Cathode Materials for High-Performance Lithium-Ion Batteries", Advanced Materials, Jun. 2008, pp. 2251-2269.
Yang et al., "Preparation of Spherical Titanium Powders from Polygonal Titanium Hydride Powders by Radio Frequency Plasma Treatment" Materials Transactions, vol. 54, No. 12 (2013) pp. 2313 to 2316.
Zavilopulo, A. N., et al., "Ionization and Dissociative Ionization of Methane Molecules", Technical Physics, vol. 58, No. 9, 2013, pp. 1251-1257.
Zeng, X., et al., "Growth and morphology of carbon nanostructures by microwave-assisted pyrolysis of methane", Physica E., vol. 42, No. 8, 2010, pp. 2103-2108.
Zhang , K., Ph.D., "The Microstructure and Properties of Hipped Powder Ti Alloys", a thesis submitted to the University of Birmingham, College of Engineering and Physical Sciences, Apr. 2009, in 65 pages.
Zhang et al., Microstructures and properties of high-entropy alloys, Progress in Materials Science, vol. 61, 2013, pp. 1-93.
Zhang, H., et al., "Plasma activation of methane for hydrogen production in a N2 rotating gliding arc warm plasma: A chemical kinetics study", Chemical Engineering Journal, vol. 345, 2018, pp. 67-78.
Zhang, J., et al., "Flexible and ion-conducting membrane electrolytes for solid-state lithium batteries: Dispersion of garnet nanoparticles in insulating polyethylene oxide", Nano Energy, vol. 28, 2016, pp. 447-454.
Zhang, X. et al., "High thickness tungsten coating with low oxygen content prepared by air plasma spray", Cailliao Gongcheng. (2014) (5) pp. 23-28 (Year: 2014).
Zhang, Y. D. et al., "High-energy cathode materials for Li-ion batteries: A review of recent developments", Science China Technological Sciences, Sep. 2015, vol. 58(11), pp. 1809-1828.
Zhang, Y. S. et al., "Core-shell structured titanium-nitrogen alloys with high strength, high thermal stability and good plasticity", Scientific Reports, Jan. 2017, vol. 7, in 8 pages.
Zhong, R., et al., "Continuous preparation and formation mechanism of few-layer graphene by gliding arc plasma", Chemical Engineering Journal, vol. 387, 2020, 10 pages.
Zielinski, A et al., "Modeling and Analysis of a Dual-Channel Plasma Torch in Pulsed Mode Operation for Industrial Space, and Launch Applications", IEEE Transactions on Plasma Science, Jul. 2015, vol. 43(7), pp. 2201-2206.
6K, "6K Launches World's First Premium Metal Powders for Additive Manufacturing Derived From Sustainable Sources", Cision PR Newswire, Nov. 4, 2019, in 1 page. URL: https://www.prnewswire.com/news-releases/6k-launches-worlds-first-premium-metal-powders-for-additive-manufacturing-derived-from-sustainable-sources-300950791.html.
Collin, J. E., et al., "Ionization of methane and it's electronic energy levels", Canadian Journal of Chemistry, 2011, vol. 45, No. 16, pp. 1875-1882.
Decker, J., et al., "Sample preparation protocols for realization of reproducible characterization of single-wall carbon nanotubes", Metrologia, 2009, vol. 46, No. 6, pp. 682-692.
Ding, F., et al., "The Importance of Strong Carbon-Metal Adhesion for Catalytic Nucleation of Single-Walled Carbon Nanotubes", Nano Letters, 2008, vol. 8, No. 2, pp. 463-468.
Dors, M., et al., "Chemical Kinetics of Methane Pyrolysis in Microwave Plasma at Atmospheric Pressure", Plasma Chem Plasma Process, 2013, vol. 34, No. 2, pp. 313-326.
International Search Report and Written Opinion, re PCT Application No. PCT/US23/24810, mailed Sep. 20, 2023.
Irle, S., et al., "Milestones in molecular dynamics simulations of single-walled carbon nanotube formation: A brief critical review", Nano Research, 2009, vol. 2, No. 10, 14 pages.
Jasek, O., et al., "Microwave plasma-based high temperature dehydrogenation of hydrocarbons and alcohols as a single route to highly efficient gas phase synthesis of freestanding graphene", Nanotechnology, 2021, vol. 32, 11 pages.
Jasinski, M., et al., "Hydrogen production via methane reforming using various microwave plasma sources", Chem. Listy, 2008, vol. 102, pp. s1332-s1337.
Kim, K. S., et al., "Synthesis of single-walled carbon nanotubes by induction thermal plasma", Nano Research, 2009, vol. 2, No. 10, pp. 800-817.
Kumal, R. R., et al., "Microwave Plasma Formation of Nanographene and Graphitic Carbon Black", C—Journal of Carbon Research, 2020, vol. 6, No. 4, 10 pages.
Lin et al., A low temperature molten salt process for aluminothermic reduction of silicon oxides to crystalline Si for Li-ion batteries, Energy Environ. Sci., 2015, 8, 3187 (Year: 2015).
Liu, Z., et al., "Synthesis and characterization of LiNi1—x—yCoxMnyO2 as the cathode materials of secondary lithium batteries", Journal of Power Sources, vol. 81-82, Sep. 1999, pp. 416-419.

(56) References Cited

OTHER PUBLICATIONS

Miller et al., The reduction of silica with carbon and silicon carbide, Journal of the American Ceramic Society, 1978, 62 (Year: 1978).
Seehra, M. S., et al., "Correlation between X-ray diffraction and Raman spectra of 16 commercial graphene—based materials and their resulting classification", Carbon N Y., 2017, vol. 111, pp. 380-384.
SK makes world's 1st NCM battery with 90% nickel, The Investor, available online <https://www.theinvestor.co.kr/view.php?ud=20200810000820>, dated Aug. 10, 2020, 2 pages.

* cited by examiner

PLASMA APPARATUS AND METHODS FOR PROCESSING FEED MATERIAL UTILIZING AN UPSTREAM SWIRL MODULE AND COMPOSITE GAS FLOWS

INCORPORATION BY REFERENCE TO ANY PRIORITY APPLICATIONS

This application claims the priority benefit under 35 U.S.C. § 119(e) of U.S. Provisional Application No. 63/350,746, filed Jun. 9, 2022, the entire disclosure of which is incorporated herein by reference in its entirety. Any and all applications for which a foreign or domestic priority claim is identified in the Application Data Sheet as filed with the present application are hereby incorporated by reference under 37 CFR 1.57.

BACKGROUND

Field

The present invention relates to apparatuses and methods for plasma material processing and, more particularly, to apparatuses and methods for microwave plasma material processing.

Description

Plasma torches generate and provide high temperature directed flows of plasma for a variety of purposes. The two main types of plasma torches are induction plasma torches and microwave plasma torches. Generally, inductive plasmas suffer from plasma non-uniformity. This non-uniformity leads to limitations on the ability of inductive plasmas to process certain materials. Furthermore, significant differences exist between the microwave plasma apparatuses and other plasma generation torches, such as induction plasma. For example, microwave plasma is hotter on the interior of the plasma plume, while induction is hotter on the outside of the plumes. In particular, the outer region of an induction plasma can reach about 10,000 K while the inside processing region may only reach about 1,000 K. This large temperature difference leads to material processing and feeding problems. Furthermore, induction plasma apparatuses are unable to process feedstocks at low enough temperatures to avoid melting of certain feed materials without extinguishing the plasma.

A conventional microwave plasma apparatus for processing a material includes a plasma chamber, a microwave radiation source, and a waveguide guiding microwave radiation from the microwave radiation source to the plasma chamber. A process gas flows through the plasma chamber and the microwave radiation couples to the process gas to produce a plasma jet. A process material is introduced to the plasma chamber, becomes entrained in the plasma jet, and is thereby transformed to a stream of product material droplets or particles.

The plasma jet may be stabilized within the plasma chamber by contact with a swirling gas flow. Stabilizing the plasma jet prevents it from contacting the plasma chamber and thereby enables use of conventional refractory materials to contain the extremely high temperatures of the plasma.

SUMMARY

For purposes of this summary, certain aspects, advantages, and novel features of the invention are described herein. It is to be understood that not all such advantages necessarily may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

Some embodiments herein are directed to a microwave plasma apparatus for processing a material, comprising: a first flow module, a second flow module, and a liner; a first swirl module in communication with the second flow module, the first swirl module comprising a plurality of first gas inlets, the plurality of first gas inlets configured to generate a first swirl gas flow towards the second swirl module; and the second swirl module comprising a plurality of second gas inlets, the plurality of second gas inlets configured to generate a second swirl gas flow towards the liner, wherein the first swirl module and the second swirl module are configured such that the first swirl gas flow and the second swirl gas flow are combined into a composite gas flow prior to entering the liner.

In some embodiments, the microwave plasma apparatus further comprises a microwave power source in communication with the composite gas flow and configured to provide microwave radiation to generate a microwave plasma upon contact with the composite gas flow. In some embodiments, the microwave power source provides microwave radiation of at least 70 KW.

In some embodiments, The microwave plasma apparatus further comprises one or more feed material inlets in communication with the first flow module, the second flow module, or the liner, the one or more feed material inlets configured to provide a feed material to the microwave plasma.

In some embodiments, the plurality of first gas inlets is configured to generate the first swirl gas flow in a counterclockwise direction. In some embodiments, the plurality of second gas inlets is configured to generate the second swirl gas flow in a counterclockwise direction. In some embodiments, the plurality of gas inlets is configured to generate the second swirl gas flow in a clockwise direction. In some embodiments, the plurality of first gas inlets is configured to generate the first swirl gas flow in a clockwise direction. In some embodiments, the plurality of second gas inlets is configured to generate the second swirl gas flow in a counterclockwise direction. In some embodiments, the plurality of second gas inlets is configured to generate the second swirl gas flow in a clockwise direction.

In some embodiments, the plurality of first gas inlets comprises 2 inlets. In some embodiments, the plurality of second gas inlets comprises 2 inlets. In some embodiments, the plurality of first gas inlets comprises more than 2 inlets. In some embodiments, the plurality of second gas inlets comprises more than 2 inlets.

In some embodiments, at least one of the plurality of first gas inlets is oriented at an angle between 0° and 90° relative to at least one other of the plurality of first gas inlets. In some embodiments, at least one of the plurality of second gas inlets is oriented at an angle between 0° and 90° relative to at least one other of the plurality of second gas inlets.

In some embodiments, wherein the first swirl gas flow comprises an ionizing gas. In some embodiments, the plurality of first gas inlets comprises inlet diameters between about 0.335 inches and about 0.393 inches. In some embodiments, the plurality of second gas inlets comprises inlet diameters between about 0.0161 inches and about 0.0345 inches.

In some embodiments, the first flow module, the second flow module, and the liner are further configured to direct the composite gas flow to a reaction chamber downstream of the liner.

BRIEF DESCRIPTION OF THE DRAWINGS

The drawings are provided to illustrate example embodiments and are not intended to limit the scope of the disclosure. A better understanding of the systems and methods described herein will be appreciated upon reference to the following description in conjunction with the accompanying drawings, wherein.

DETAILED DESCRIPTION

Figure 1:
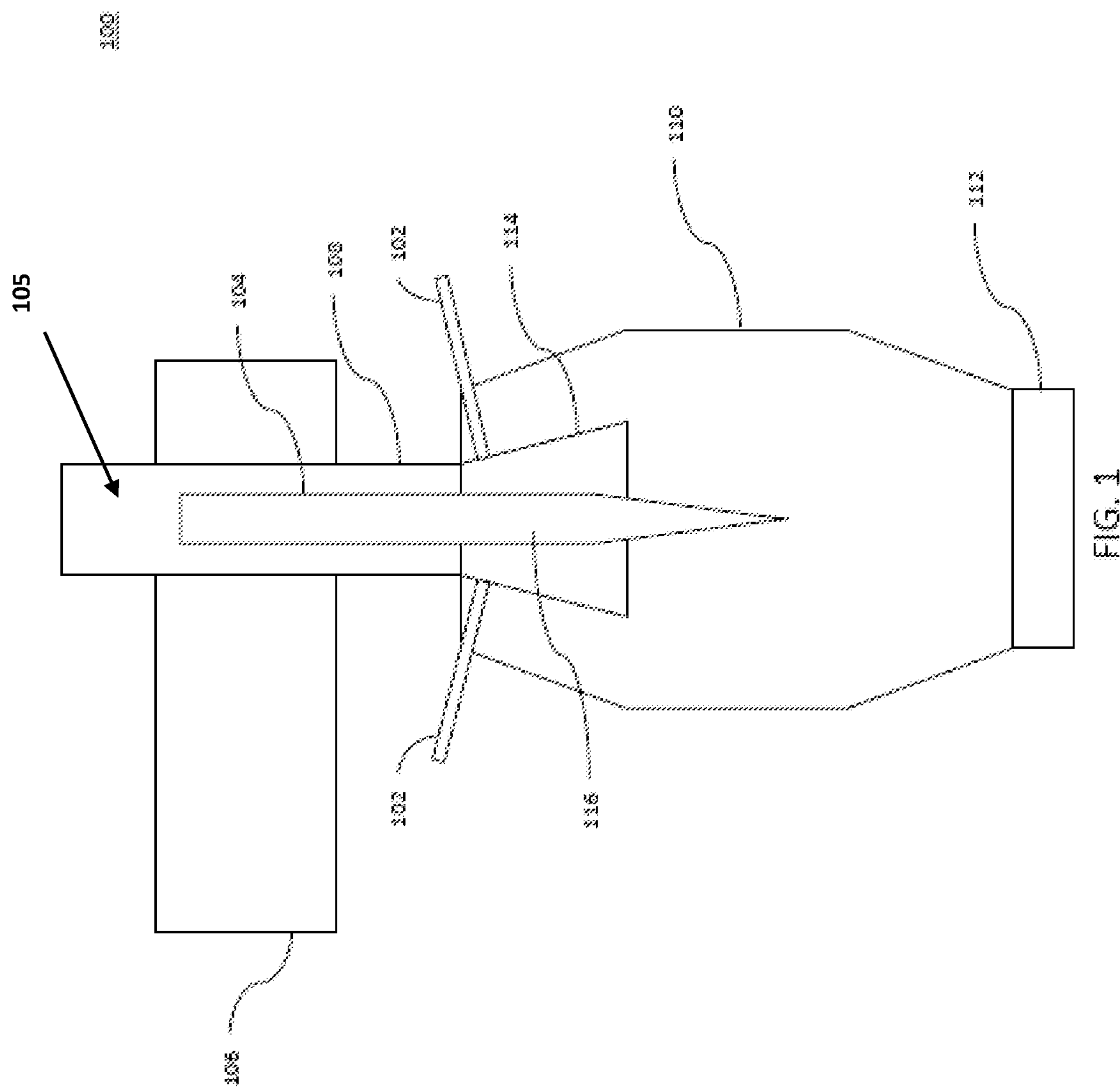
FIG. 1 illustrates an example microwave plasma torch 100 that can be used in the processing of feed material materials.

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto or as presented in the future is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present technology.

In some embodiments, the plasma of a microwave plasma apparatus may be stabilized and centered by a swirl gas flow. For example, small swirl orifice jets may be present within the apparatus to inject swirl gases. The high velocity and swirling action of this swirl gas flow protects the inner diameter of the torch from the high heat associated with the plasma. An annular swirl chamber may be in fluid communication with the interior of the plasma apparatus via a plurality of swirl jets. The swirl jets may be arranged at any angle relative to the core gas flow of the apparatus. For example, the swirl jets may be arranged substantially perpendicular to, and substantially offset from, the main axis and core gas flow. In some embodiments, however, the swirl jets also may be arranged at an angle relative to the axis and core gas flow.

In some embodiments, the plasma generated by the microwave plasma torch can reach extremely high temperatures, on the order of six thousand Kelvin (6,000 K). As such, in some embodiments, the swirl gas may be supplied to the inner surface of the torch prior to ignition of the plasma jet. The swirl gas may be supplied from a swirl gas source through the swirl jets, so as to establish a flow of the swirl gas in a swirling or helical manner between the core gas flow and the inner surface. After ignition of the plasma, the swirling flow of swirl has prevents the plasma jet from adhering to the inner surface, and thereby prevents melting of the plasma chamber by conductive heat transfer between the plasma and the inner surface. The swirl gas also removes a portion of the heat transferred by radiation from the plasma to the inner surface.

FIG. 1 illustrates an example microwave plasma torch 100 that can be used in the production of materials. In some embodiments, a feedstock can be introduced, via one or more feedstock inlets 102, into a microwave plasma 104. In some embodiments, an entrainment gas flow and/or a sheath flow may be injected into the microwave plasma applicator 105 to create flow conditions within the plasma applicator prior to ignition of the plasma 104 via microwave radiation source 106. In some embodiments, the entrainment flow and sheath flow are both axis-symmetric and laminar, while in other embodiments the gas flows are swirling. In some embodiments, the feedstock may be introduced into the microwave plasma torch 100, where the feedstock may be entrained by a gas flow that directs the materials toward the plasma 104.

In some embodiments, within the microwave plasma 104, the feedstock may undergo a physical and/or chemical transformation. Inlets 102 can be used to introduce process gases to entrain and accelerate the feedstock towards plasma 104. In some embodiments, a second swirling gas flow can be created to provide sheathing for the inside wall of a plasma applicator 104 and a reaction chamber 110 to protect those structures from melting due to heat radiation from plasma 104.

Various parameters of microwave plasma 104, as created by the plasma applicator 105, may be adjusted manually or automatically in order to achieve a desired material. These parameters may include, for example, power, plasma gas flow rates, type of plasma gas, presence of an extension tube, extension tube material, level of insulation of the reactor chamber or the extension tube, level of coating of the extension tube, geometry of the extension tube (e.g. tapered/stepped), feed material size, feed material insertion rate, feed material inlet location, feed material inlet orientation, number of feed material inlets, plasma temperature, residence time and cooling rates. The resulting material may exit the plasma into a sealed chamber 112 where the material is quenched then collected.

In some embodiments, the feedstock is injected after the microwave plasma applicator for processing in the "plume" or "exhaust" of the microwave plasma torch. Thus, the plasma of the microwave plasma torch is engaged at the exit end of the plasma torch core tube 108, or further downstream. In some embodiments, adjustable downstream feeding allows engaging the feedstock with the plasma plume downstream at a temperature suitable for optimal melting of feedstock through precise targeting of temperature level and residence time. Adjusting the inlet location and plasma characteristics may allow for further customization of material characteristics. Furthermore, in some embodiments, by adjusting power, gas flow rates, pressure, and equipment configuration (e.g., introducing an extension tube), the length of the plasma plume may be adjusted.

In some embodiments, feeding configurations may include one or more individual feeding nozzles surrounding the plasma plume. The feedstock may enter the plasma from any direction and can be fed in 360° around the plasma depending on the placement and orientation of the inlets 102. Furthermore, the feedstock may enter the plasma at a specific position along the length of the plasma 104 by adjusting placement of the inlets 102, where a specific temperature has been measured and a residence time estimated for providing the desirable characteristics of the resulting material.

In some embodiments, the angle of the inlets 102 relative to the plasma 104 may be adjusted, such that the feedstock can be injected at any angle relative to the plasma 104. In some embodiments, implementation of the downstream injection method may use a downstream swirl or quenching. A downstream swirl refers to an additional swirl component that can be introduced downstream from the plasma applicator to keep the powder from the walls of the applicator 105, the reactor chamber 110, and/or an extension tube 114.

Figure 2A:
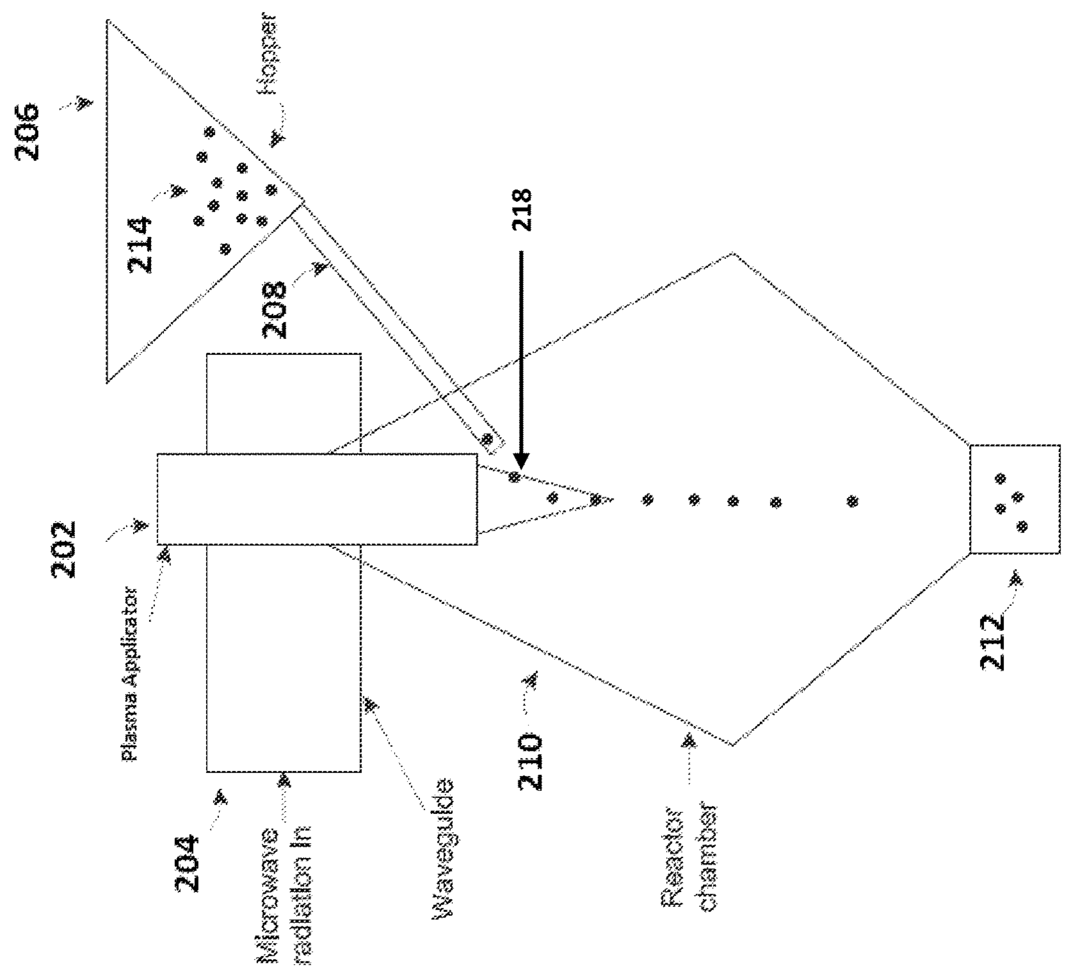
FIGS. 2A-B illustrates an exemplary microwave plasma torch that includes a side feeding hopper, thus allowing for downstream feeding.
Figure 2B:
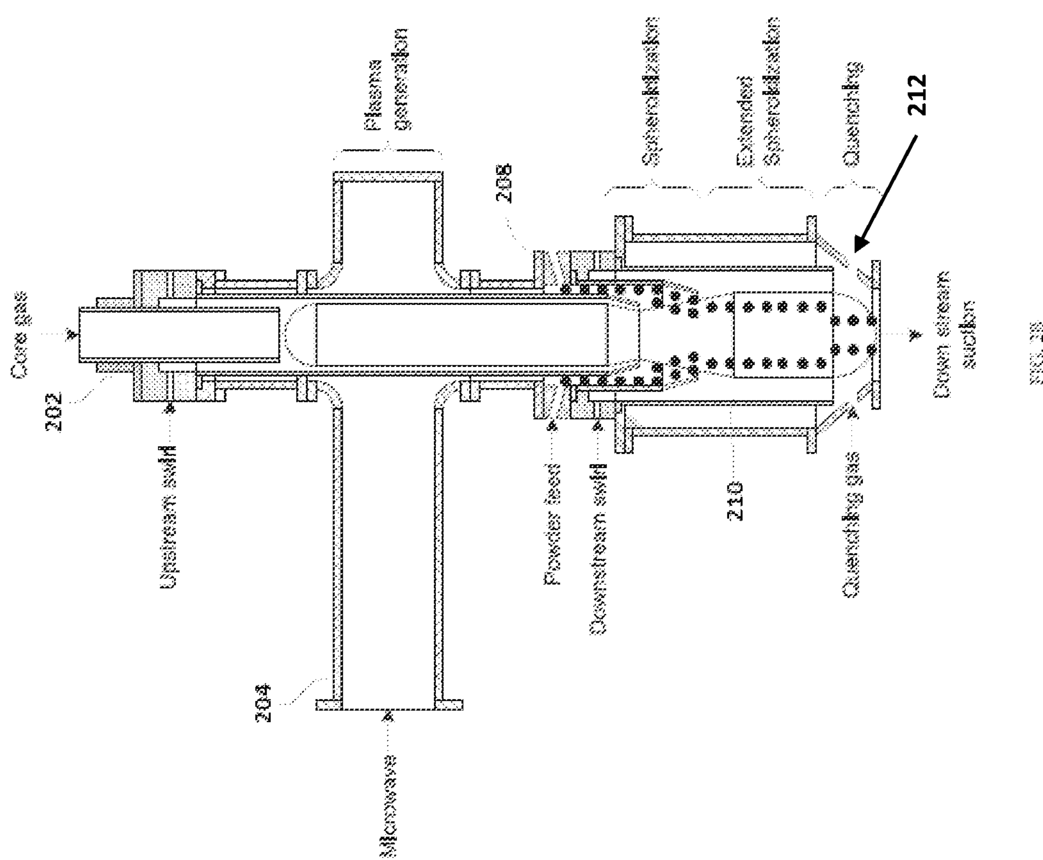

FIGS. 2A-B illustrates an exemplary microwave plasma torch that includes a side feeding hopper, thus allowing for downstream feeding. Thus, in this implementation the feedstock is injected after the microwave plasma torch applicator for processing in the "plume" or "exhaust" of the microwave plasma torch. Thus, the plasma of the microwave plasma torch is engaged at the exit end of the plasma torch to allow downstream feeding of the feedstock, as opposed to the top-feeding (or upstream feeding). This downstream feeding can advantageously extend the lifetime of the torch as the hot zone is preserved indefinitely from any material deposits on the walls of the hot zone liner. Furthermore, it allows engaging the plasma plume downstream at temperature suitable for optimal melting of powders through precise targeting of temperature level and residence time. For example, there is the ability to dial the length of the plume using microwave powder, gas flows, and pressure in the quenching vessel that contains the plasma plume.

Generally, the downstream feeding can utilize two main hardware configurations to establish a stable plasma plume which are: annular torch, such as described in U.S. Pat. Pub. No. 2018/0297122, the entirety of which is hereby incorporated by reference, or swirl torches described in U.S. Pat. No. 8,748,785 B2 and U.S. Pat. No. 9,932,673 B2, the entireties of which are hereby incorporated by reference. A feed system close-coupled with the plasma plume at the exit of the plasma torch is used to feed powder axisymmetrically to preserve process homogeneity.

Other feeding configurations may include one or several individual feeding nozzles surrounding the plasma plume. The feedstock powder can enter the plasma at a point from any direction and can be fed in from any direction, 360° around the plasma, into the point within the plasma. The feedstock powder can enter the plasma at a specific position along the length of the plasma plume where a specific temperature has been measured and a residence time estimated for sufficient melting of the particles. The melted particles exit the plasma into a sealed chamber where they are quenched then collected.

The feed materials 214 can be introduced into a microwave plasma applicator 202. Hopper 206 can be used to store the feed material 214 before feeding the feed material 214 into the microwave plasma applicator 202, plume and/or exhaust 218. The feed material 214 can be injected at any angle to the longitudinal direction of the plasma applicator 302. 5, 10, 15, 20, 25, 30, 35, 40, 45, 50, or 55 degrees. In some embodiments, the feedstock can be injected at an angle of greater than 5, 10, 15, 20, 25, 30, 35, 40, 45, 50, or 55 degrees. In some embodiments, the feedstock can be injected at an angle of less than 5, 10, 15, 20, 25, 30, 35, 40, 45, 50, or 55 degrees. In alternative embodiments, the feedstock can be injected along the longitudinal axis of the plasma torch.

The microwave radiation can be brought into plasma applicator 202 through waveguide 204. The feed material 214 is fed into a plasma chamber 210 and is placed into contact with the plasma generated by the plasma applicator 202. When in contact with the plasma, plasma plume, or plasma exhaust 218, the feed material melts. While still in the plasma chamber 210, the feed material 214 cools and solidifies before being collected into a container 212. Alternatively, the feed material 214 can exit the plasma chamber 210 through the outlet 212 while still in a melted phase and cool and solidify outside the plasma chamber. In some embodiments, a quenching chamber may be used, which may or may not use positive pressure. While described separately from FIG. 1, the embodiments of FIGS. 2A and 2B are understood to use similar features and conditions to the embodiment of FIG. 1.

Figure 3:
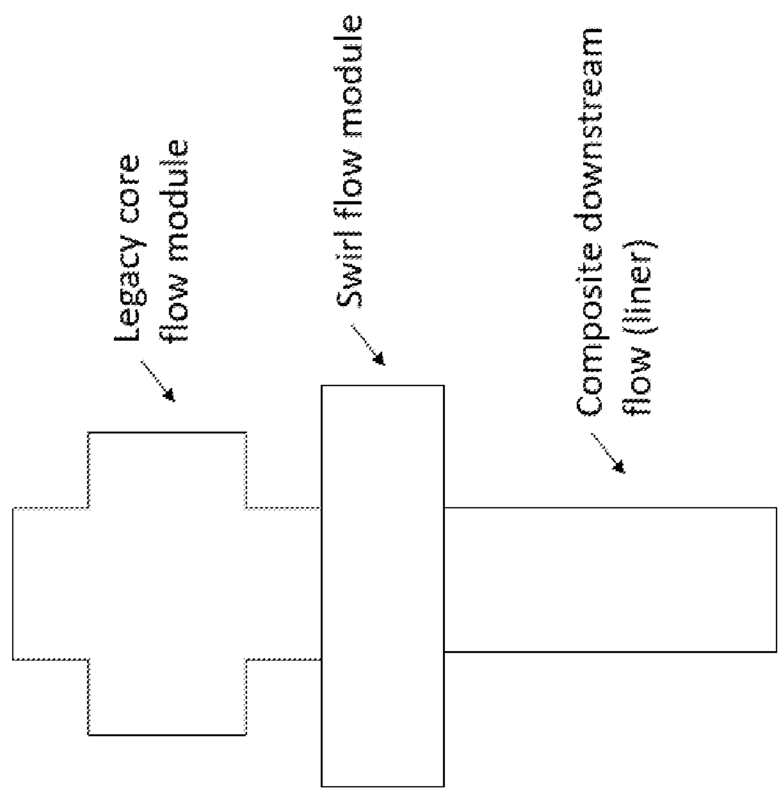
FIG. 3. illustrates another example plasma apparatus for processing feed materials.

FIG. 3 illustrates another example plasma apparatus for processing feed materials. In some embodiments, the swirl gas flow may originate in the swirl chamber or swirl module of the microwave plasma apparatus. The swirl gas flow may be generated in the swirl chamber with small orifice swirl jets that are oriented at an angle relative to the interior surface of the torch, which may comprise a protective liner. The high velocity and swirling action of this flow protects the inner diameter of the torch from the high heat associated with the plasma. In some embodiments, the core gas flow comprising the main ionizing gas originates from a core flow chamber or module upstream of the swirl flow module. In some embodiments, this core gas flow is intended to be substantially straight and to absorb the majority of the microwave energy (relative to the swirling flow).

Figure 4:
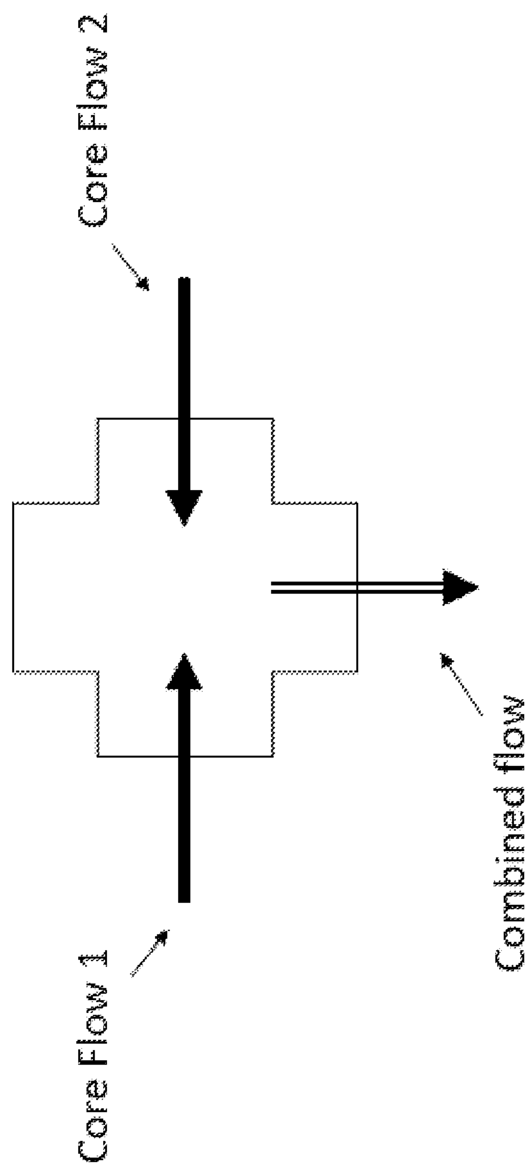
FIG. 4 illustrates an example core flow module of a plasma apparatus for processing feed material.

As shown in FIG. 4, in some embodiments, the core flow module combines two opposingly oriented gas flows, which form a bend before mixing and flowing into the swirl module downstream of the core flow module. In some instances of this configuration, the core plasma gas flow and the swirl flows may impinge on each other and create undesirable flow deviations that vary with time. Although these deviations can assist with flow mixing, the deviations create non-uniformity in the resulting plasma and reduce flow coherence. In essence, the plasma plume needs to constantly 'update' to the variable incoming flow pattern.

According to some embodiments, a new flow paradigm is described herein for the core flow module, in which a vortex or swirling component is added to the flow, upstream of the swirl module. Combining the swirling flow component from the core flow module with the swirl flow from the swirl flow module forms a composite flow, which enters the liner region. In some embodiments, the composition and temperature of gas flows from the core swirl flow and the swirl flow module are substantially similar or identical. These flows may form the "composite flow" (i.e., two upstream swirl flows). However, the outer swirling flow from the swirl flow module, introduced after the core swirl flow, may be injected at a significantly higher velocity at the outer perimeter of the flow, so as to shield the liner from the hot temperature of the ionized core swirl flow. The high angular momentum of the swirl flow from the swirl flow module thrusts it outward toward the perimeter, keeping it outside and away from the core swirl flow. In some embodiments, the inlet speed of the swirl flow is preferably 3.5×-9× faster than the core swirl flow, although acceptable performance may be achieved at an even broader range such as, for example, 1.5×-20× faster than the core swirl flow.

Figure 5:
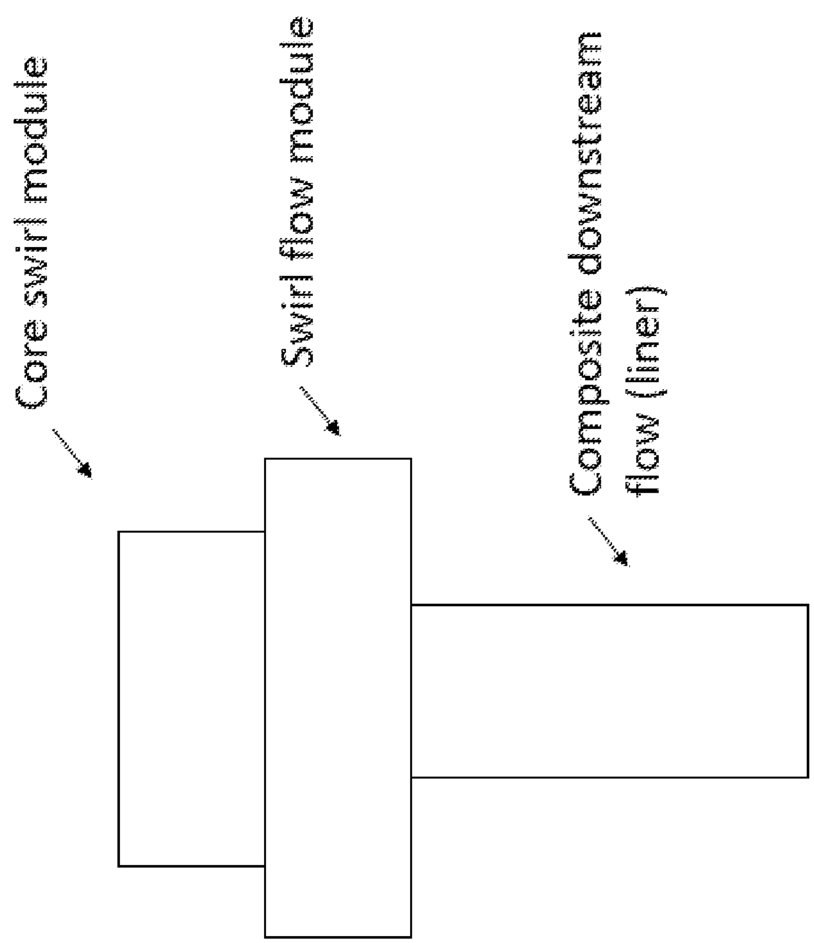
FIG. 5 illustrates an example microwave plasma processing apparatus according to some embodiments herein.

FIG. 5 illustrates an example microwave plasma processing apparatus according to some embodiments herein. As illustrated in FIG. 5, the microwave plasma apparatus comprises a core swirl module upstream of the swirl flow module. In some embodiments, adding swirl to the core flow provides coherence and uniformity to the gas flow. In the configuration of FIG. 5, any deviation from the nominal flow pattern will be a matter of degree and not of form, whereas the core flow module configuration of FIG. 3 creates variability in the flow form. In some embodiments, the swirling nature of the upstream core swirl flow provides fullness and stability to the plasma flame and expands the input flow ranges allowable to maintain the plasma. For example, in some embodiments herein, the power/flow ration may range from about 0.3 kW/scfm to about 5.5 kW/scfm. Thus, in some embodiments, at a low power around 10 kW, the gas flow rate of either the core swirl flow or the outer swirl flow could be as low as 1.8 scfm, and at a high power of 100 kW, gas flow could be as high as 330 scfm. The process sequence according to FIG. 5 begins with the core swirl module, followed by the swirl flow module, a microwave plasma applicator and generation zone, and the material feed. In some embodiments, a quenching gas may be introduced in the same location as the material feed. This process flow and plasma apparatus configuration differs from conventional configurations as the configuration of the embodiments herein involves generation of gas swirl flow upstream of the plasma applicator and material feed. For example, in the process sequence shown in FIG. 2B, a core flow module is located upstream of the plasma applicator and generator. The core flow module generates a substantially straight gas flow towards to microwave generator 204. A swirl flow is not generated prior to the microwave generator or the material feed of the plasma apparatus. Rather, a swirl flow is generated downstream of the microwave generator 204 and the material feed.

Figure 6:
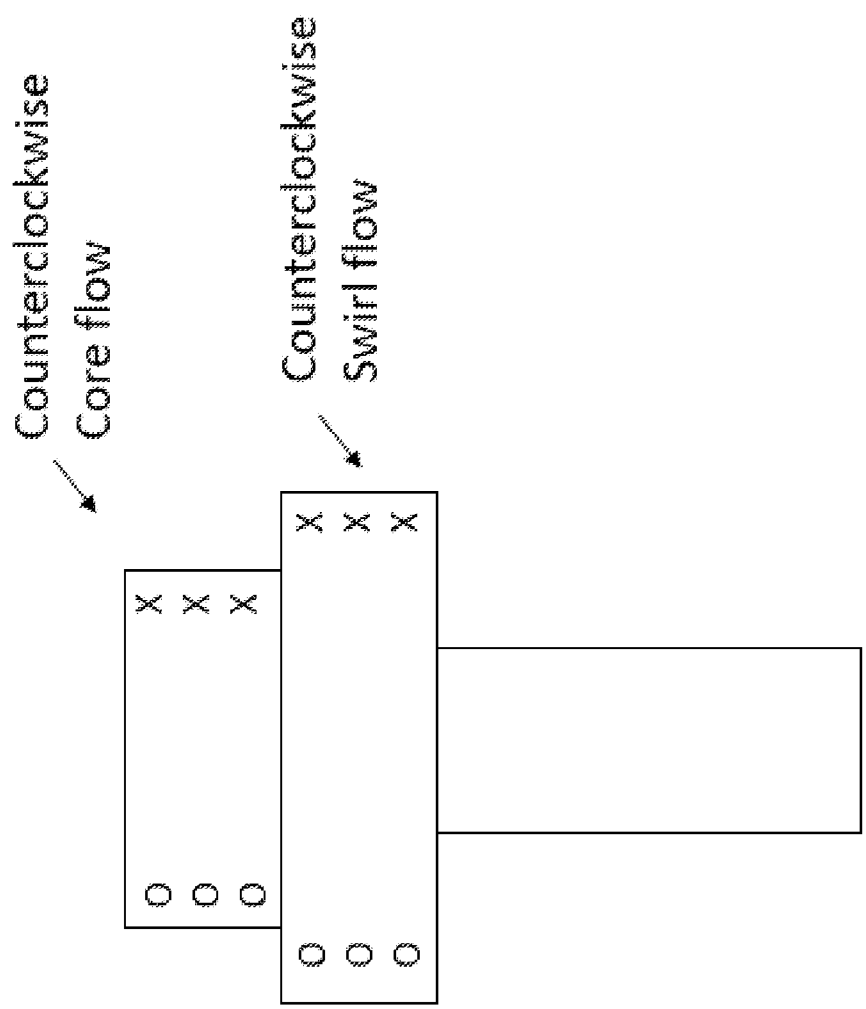
FIG. 6 illustrates an example core swirl flow module and swirl flow module for generating a counterclockwise flow according to some embodiments herein.

In some embodiments, as shown in the configuration of FIG. 6, the core swirl module and swirl flow module may generate gas flows that are swirling in the same direction. For example, both modules may generate clockwise or counterclockwise flows using corresponding swirl jets. However, using an anti-spin configuration, in which the core swirl flow generates a flow of the opposite orientation to the swirl flow module, also exhibits improved plasma performance relative to a straight core flow. This suggests that core flow coherence, even in opposition to the swirl flow, is important for plasma stability.

Figure 7:
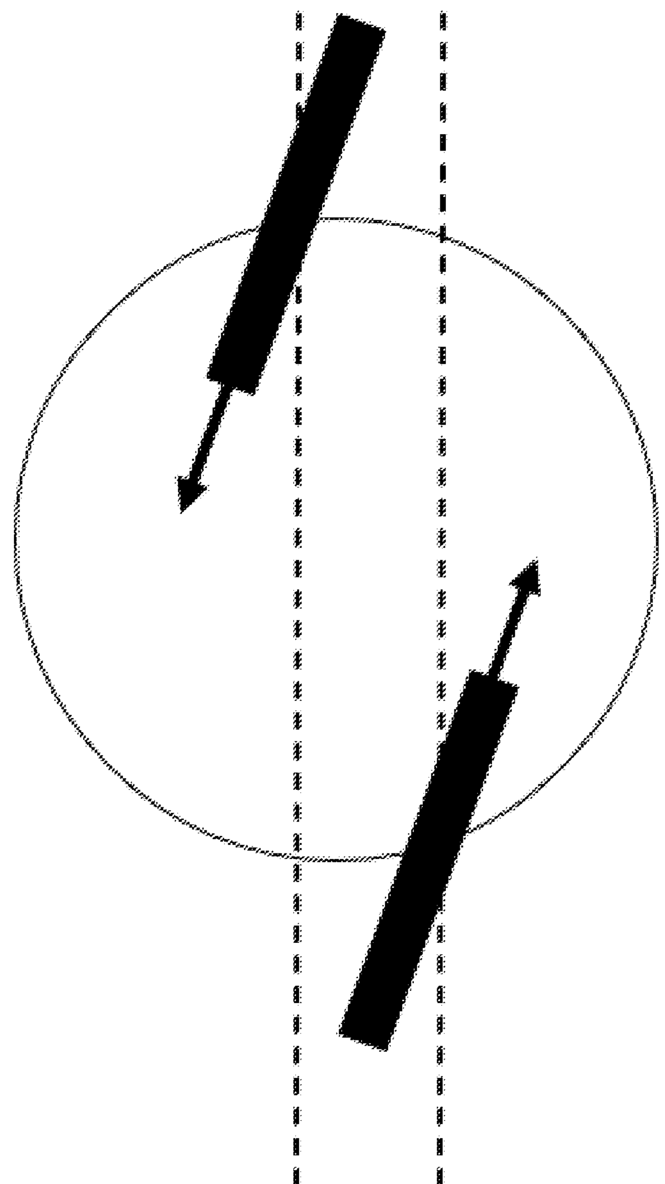
FIG. 7 illustrates an example swirl gas inlet configuration in which a counterclockwise swirl gas flow is generated according to some embodiments herein.
Figure 8:
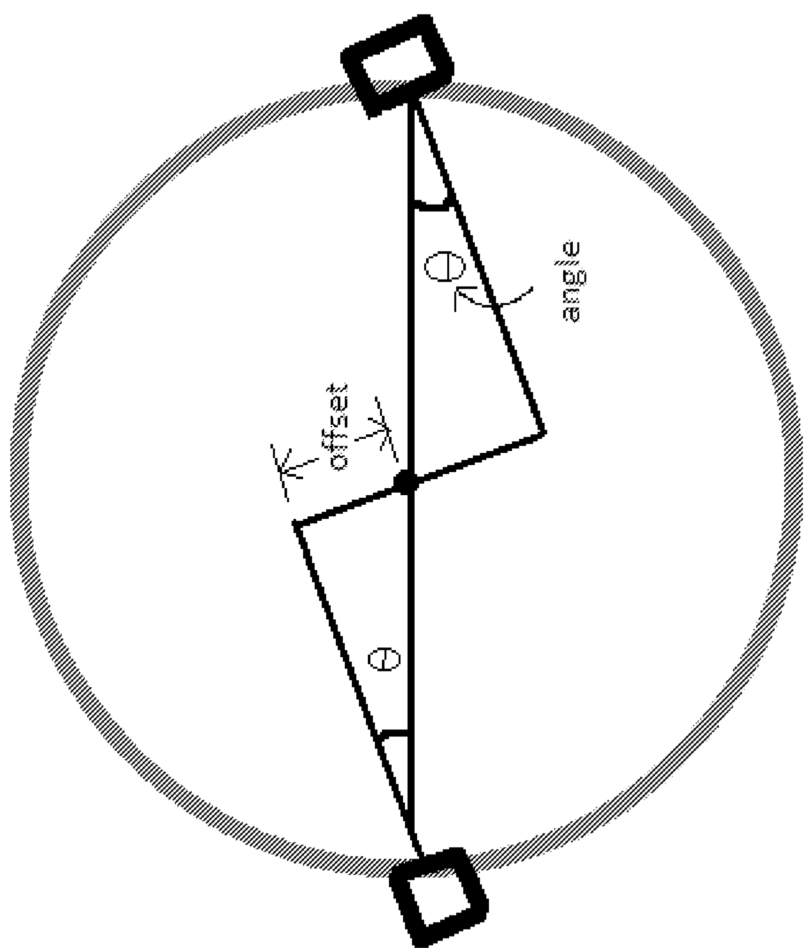
FIG. 8 illustrates an example of the concepts of angle and offset with respect to the jets.

In some embodiments, the swirling core flow can be generated differently across several variables. A number (n=2, 3, 4, 5, 6, 7, 8, 9, 10, 15, 20, 25, 30, 35, 40, 45, 50, 100, or any value between the aforementioned values) of inlet flows can be arranged with offset and tilt relative to a central point of the plasma tube. Orienting the system from a bird's eye view, the "offset" may represent the shortest distance between an inlet's axis and the point of revolution in the center of the system. In other words, instead of jets being pointed directly toward the center, the jets may be angled relative to the central point by some "offset." Thus, in some embodiments, the jets are "angled", or the jets are "offset." FIG. 8 illustrates an example of the concepts of angle and offset with respect to the jets. For example, one or more inlet flows may be oriented relative to the center point at an angle of about 0°, about 5°, about 10°, about 15°, about 20°, about 25°, about 30°, about 35°, about 40°, about 45°, about 50°, about 55°, about 60°, about 65°, about 70°, about 75°, about 80°, about 85°, about 90°, or any value in between the aforementioned value. In some embodiments, one or more inlet flows may be oriented relative to the center point at an angle of about 9.6° or 10°. For example, the diameter of the core swirl inlets may be less than about 0.335 inches or, between about 0.335 inches and about 0.393 inches. For the secondary swirl module inlets, the diameter may be about 0.023 inches. In some embodiments, the diameter of the swirl module inlets may be between about 0.0161 inches and about 0.0345 inches. Additionally, the inlet diameter of the orifices can be changed to render the desired flow velocity. FIG. 7 illustrates an example swirl gas inlet configuration in which a counterclockwise swirl gas flow is generated.

In some embodiments, the configuration of FIG. 5 comprising a core swirl module and swirl flow module may enable generation of a stable plasma at lower power levels. For example, a stable and uniform plasma may be generated at power levels at about 70 KW or higher. Instability of the convention designs prevents using higher power levels. This instability grew with increasing flows and resulted in arcing and hot spots on the liner of the plasma apparatus. Thus, conventional microwave plasma apparatuses only utilize powers up to 45 kW. Furthermore, the stability achieved with the designs described herein yields a more compact plasma, which therefore interacts less with the liner. For example, when utilizing $Ar/H_2$ gases, this compact plasma allows the reduction of % $H_2$ down to 5% while maintaining stability. In conventional configurations, higher $H_2$ percentages were previously needed in order to keep the plasma more compact.

Microwave Plasma Processing

In a microwave plasma process, the feedstock may be entrained in an inert and/or reducing gas environment and injected into the microwave plasma, the microwave plasma plume, or the microwave plasma exhaust. Upon injection into a hot plasma (or plasma plume or exhaust), the feedstock may undergo a physical and/or chemical transformation (e.g., spheroidization). After processing, the resulting material may be released into a chamber filled with an inert gas and directed into hermetically sealed drums where is it stored. This process can be carried out at atmospheric pressure, in a partial vacuum, or at a slightly higher pressure than atmospheric pressure.

In alternative embodiments, the process can be carried out in a low, medium, or high vacuum environment. The process can run in batches or continuously, with the drums being replaced as they fill up with processed material. By controlling the process parameters, such as cooling gas flow rate, residence time, plasma conditions, cooling gas composition, various material characteristics can be controlled.

Residence time of the particles within a hot zone of the plasma can also be adjusted to provide control over the resulting material characteristics. That is, the length of time the particles are exposed to the plasma determines the extent of melting of the feedstock particles (i.e., surface of the particle melted as compared to the inner most portion or core of the particle). Residence time can be adjusted by adjusting such operating variables of particle injection rate and flow rate (and conditions, such as laminar flow or turbulent flow) within the hot zone. Equipment changes can also be used to adjust residence time. For example, residence time can be adjusted by changing the cross-sectional area of the plasma, by, for example, extending the plasma. In some embodiments, extending the plasma may comprise incorporating an extension tube into the microwave plasma apparatus.

Additional Embodiments

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the embodiments of the disclosed invention. Any methods disclosed herein need not be performed in the order recited. Thus, it is intended that the scope of the invention herein disclosed should not be limited by the particular embodiments described above.

It will be appreciated that the systems and methods of the disclosure each have several innovative aspects, no single one of which is solely responsible or required for the desirable attributes disclosed herein. The various features and processes described above may be used independently of one another or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will also be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. In addition, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Further, while the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various implementations described and the appended claims. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are at standard conditions including temperature and pressure.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present. The headings provided herein, if any, are for convenience only and do not necessarily affect the scope or meaning of the devices and methods disclosed herein.

Accordingly, the claims are not intended to be limited to the embodiments shown herein but are to be accorded the widest scope consistent with this disclosure, the principles and the novel features disclosed herein.

What is claimed is:

1. A microwave plasma apparatus for processing a material, comprising:

a first swirl module, a second swirl module downstream of the first swirl module, a waveguide downstream of the first swirl module and the second swirl module, and a liner;

the first swirl module in communication with the second swirl module, the first swirl module comprising a plurality of first gas inlets, the plurality of first gas inlets configured to generate a first swirl gas flow towards the second swirl module; and the second swirl module comprising a plurality of second gas inlets, the plurality of second gas inlets configured to generate a second swirl gas flow towards the liner, wherein the first swirl module and the second swirl module are configured such that the first swirl gas flow and the second swirl gas flow are combined into a composite gas flow prior to entering the liner;

wherein the plurality of second gas inlets are configured to generate a second swirl gas flow that is 3.5 to 9 times faster than the first swirl gas flow.

2. The microwave plasma apparatus of claim 1, further comprising a microwave power source in communication with the composite gas flow and configured to provide microwave radiation to generate a microwave plasma upon contact with the composite gas flow.

3. The microwave plasma apparatus of claim 2, wherein the microwave power source provides microwave radiation of at least 70 KW.

4. The microwave plasma apparatus of claim 2, further comprising one or more feed material inlets in communication with the first swirl module, the second swirl module, or the liner, the one or more feed material inlets configured to provide a feed material to the microwave plasma.

5. The microwave plasma apparatus of claim 1, wherein the plurality of first gas inlets is configured to generate the first swirl gas flow in a counterclockwise direction.

6. The microwave plasma apparatus of claim 1, wherein the plurality of second gas inlets is configured to generate the second swirl gas flow in a counterclockwise direction.

7. The microwave plasma apparatus of claim 1, wherein the plurality of first and second gas inlets are configured to generate the composite gas flow in a clockwise direction.

8. The microwave plasma apparatus of claim 1, wherein the plurality of first gas inlets is configured to generate the first swirl gas flow in a clockwise direction.

9. The microwave plasma apparatus of claim 1, wherein the plurality of second gas inlets is configured to generate the second swirl gas flow in a clockwise direction.

10. The microwave plasma apparatus of claim 1, wherein the plurality of first gas inlets comprises 2 inlets.

11. The microwave plasma apparatus of claim 1, wherein the plurality of second gas inlets comprises 2 inlets.

12. The microwave plasma apparatus of claim 1, wherein the plurality of first gas inlets comprises more than 2 inlets.

13. The microwave plasma apparatus of claim 1, wherein the plurality of second gas inlets comprises more than 2 inlets.

14. The microwave plasma apparatus of claim 1, wherein at least one of the plurality of first gas inlets is oriented at an angle between 0° and 90° relative to at least one other of the plurality of first gas inlets.

15. The microwave plasma apparatus of claim 1, wherein at least one of the plurality of second gas inlets is oriented at an angle between 0° and 90° relative to at least one other of the plurality of second gas inlets.

16. The microwave plasma apparatus of claim 1, wherein the first swirl gas flow comprises an ionizing gas.

17. The microwave plasma apparatus of claim 1, wherein the plurality of first gas inlets comprises inlet diameters between 0.335 inches and 0.393 inches.

18. The microwave plasma apparatus of claim 1, wherein the plurality of second gas inlets comprises inlet diameters between 0.0161 inches and 0.0345 inches.

19. The microwave plasma apparatus of claim 1, wherein the first swirl module, the second swirl module, and the liner are further configured to direct the composite gas flow to a reaction chamber downstream of the liner.

* * * * *